(12) United States Patent
Raring et al.

(10) Patent No.: US 10,297,977 B1
(45) Date of Patent: *May 21, 2019

(54) LASER DEVICE AND METHOD FOR A VEHICLE

(71) Applicant: Soraa Laser Diode, Inc., Goleta, CA (US)

(72) Inventors: James W. Raring, Santa Barbara, CA (US); Paul Rudy, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/000,802

(22) Filed: Jun. 5, 2018

Related U.S. Application Data

(63) Continuation of application No. 15/710,715, filed on Sep. 20, 2017, now Pat. No. 10,084,281, which is a
(Continued)

(51) Int. Cl.
*H05B 33/00* (2006.01)
*H01L 33/60* (2010.01)
(Continued)

(52) U.S. Cl.
CPC ....... *H01S 5/0428* (2013.01); *F41H 13/0056* (2013.01); *H01S 3/1603* (2013.01);
(Continued)

(58) Field of Classification Search
CPC . H01L 33/644; H01L 33/508; F41H 13/0056; H01S 3/1603; H01S 5/02208; H01S 5/0428; H01S 3/1643
(Continued)

(56) References Cited

U.S. PATENT DOCUMENTS 4,341,592 A 7/1982 Shortes et al.
4,860,687 A 8/1989 Frijlink
(Continued)

FOREIGN PATENT DOCUMENTS

CN 101009347 3/1987
CN 1538534 10/2004
(Continued)

OTHER PUBLICATIONS

Abare "Cleaved and Etched Facet Nitride Laser Diodes," IEEE Journal of Selected Topics in Quantum Electronics, vol. 4, No. 3, pp. 505-509 (May 1998).
(Continued)

*Primary Examiner* — Tuan N Nguyen
(74) *Attorney, Agent, or Firm* — Kilpatrick Townsend & Stockton LLP

(57) ABSTRACT

A laser illumination or dazzler device and method. More specifically, examples of the present invention provide laser illumination or dazzling devices power by one or more violet, blue, or green laser diodes characterized by a wavelength from about 390 nm to about 550 nm. In some examples the laser illumination or dazzling devices include a laser pumped phosphor wherein a laser beam with a first wavelength excites a phosphor member to emit electromagnetic at a second wavelength. In various examples, laser illumination or dazzling devices according to the present invention include polar, non-polar, or semi-polar laser diodes. In a specific example, a single laser illumination or dazzling device includes a plurality of violet, blue, or green laser diodes. There are other examples as well.

20 Claims, 10 Drawing Sheets

Related U.S. Application Data continuation of application No. 14/822,845, filed on Aug. 10, 2015, now Pat. No. 9,800,017, which is a continuation-in-part of application No. 13/938,048, filed on Jul. 9, 2013, now Pat. No. 9,250,044, which is a continuation-in-part of application No. 12/787,343, filed on May 25, 2010, now Pat. No. 8,509,275.

(60) Provisional application No. 61/182,104, filed on May 29, 2009.

(51) Int. Cl.

| | |
|---|---|
| *H01L 33/30* | (2010.01) |
| *F41A 33/02* | (2006.01) |
| *F41C 23/16* | (2006.01) |
| *C09K 11/06* | (2006.01) |
| *H01S 5/042* | (2006.01) |
| *F41H 13/00* | (2006.01) |
| *H01S 5/022* | (2006.01) |
| *H01S 5/343* | (2006.01) |
| *H01S 5/40* | (2006.01) |
| *H01S 5/323* | (2006.01) |
| *H01S 3/16* | (2006.01) |
| *H01S 5/026* | (2006.01) |
| *H01S 5/22* | (2006.01) |
| *H01S 5/32* | (2006.01) |

(52) U.S. Cl.
CPC ........ *H01S 3/1643* (2013.01); *H01S 5/02208* (2013.01); *H01S 5/02248* (2013.01); *H01S 5/32341* (2013.01); *H01S 5/34333* (2013.01); *H01S 5/4012* (2013.01); *H01S 5/026* (2013.01); *H01S 5/042* (2013.01); *H01S 5/22* (2013.01); *H01S 5/3202* (2013.01); *H01S 5/4031* (2013.01); *H01S 5/4087* (2013.01)

(58) Field of Classification Search
USPC .......................................... 257/99; 372/38.02
See application file for complete search history.

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 6,069,394 A | 5/2000 | Hashimoto et al. |
| 6,072,197 A | 6/2000 | Horino et al. |
| 6,129,900 A | 10/2000 | Satoh et al. |
| 6,147,953 A | 11/2000 | Duncan |
| 6,153,010 A | 11/2000 | Kiyoku et al. |
| 6,195,381 B1 | 2/2001 | Botez et al. |
| 6,239,454 B1 | 5/2001 | Glew et al. |
| 6,273,948 B1 | 8/2001 | Porowski et al. |
| 6,379,985 B1 | 4/2002 | Cervantes et al. |
| 6,398,867 B1 | 6/2002 | D'Evelyn et al. |
| 6,406,540 B1 | 6/2002 | Harris et al. |
| 6,451,157 B1 | 9/2002 | Hubacek |
| 6,489,636 B1 | 12/2002 | Goetz et al. |
| 6,586,762 B2 | 7/2003 | Kozaki |
| 6,596,079 B1 | 7/2003 | Vaudo et al. |
| 6,635,904 B2 | 10/2003 | Goetz et al. |
| 6,639,925 B2 | 10/2003 | Niwa et al. |
| 6,656,615 B2 | 12/2003 | Dwilinski et al. |
| 6,680,959 B2 | 1/2004 | Tanabe et al. |
| 6,681,064 B2 | 1/2004 | Naniwae |
| 6,686,608 B1 | 3/2004 | Takahira |
| 6,734,461 B1 | 5/2004 | Shiomi et al. |
| 6,755,932 B2 | 6/2004 | Masuda et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,861,130 B2 | 3/2005 | D'Evelyn et al. |
| 6,920,166 B2 | 7/2005 | Akasaka et al. |
| 7,001,577 B2 | 2/2006 | Zimmerman et al. |
| 7,009,199 B2 | 3/2006 | Hall |
| 7,019,325 B2 | 3/2006 | Li et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,128,849 B2 | 10/2006 | Setlur et al. |
| 7,141,829 B2 | 11/2006 | Takahashi |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 3/2007 | Ueda |
| 7,220,324 B2 | 5/2007 | Baker et al. |
| 7,252,712 B2 | 7/2007 | Dwilinski et al. |
| 7,303,630 B2 | 12/2007 | Motoki et al. |
| 7,312,156 B2 | 12/2007 | Granneman et al. |
| 7,316,746 B2 | 1/2008 | D'Evelyn et al. |
| 7,323,723 B2 | 1/2008 | Ohtsuka et al. |
| 7,338,828 B2 | 3/2008 | Imeretal |
| 7,358,542 B2 | 4/2008 | Radkov et al. |
| 7,358,543 B2 | 4/2008 | Chua et al. |
| 7,368,015 B2 | 5/2008 | D'Evelyn et al. |
| 7,381,391 B2 | 6/2008 | Spencer et al. |
| 7,390,359 B2 | 6/2008 | Miyanaga et al. |
| 7,420,261 B2 | 9/2008 | Dwilinski et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,569,206 B2 | 8/2009 | Spencer et al. |
| 7,598,104 B2 | 10/2009 | Teng et al. |
| 7,625,446 B2 | 12/2009 | D'Evelyn et al. |
| 7,642,122 B2 | 1/2010 | Tysoe et al. |
| 7,691,658 B2 | 4/2010 | Kaeding et al. |
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,124,996 B2 | 2/2012 | Raring et al. |
| 8,126,024 B1 | 2/2012 | Raring |

(56) References Cited

U.S. PATENT DOCUMENTS

| | | |
|---|---|---|
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,179 B1 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,351,478 B2 | 1/2013 | Raring et al. |
| 8,354,679 B1 | 1/2013 | D'Evelyn et al. |
| 8,355,418 B2 | 1/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,509,275 B1 | 8/2013 | Raring et al. |
| 8,510,979 B1 | 8/2013 | Mortimer |
| 8,837,546 B1 | 9/2014 | Raring et al. |
| 8,908,731 B1 | 12/2014 | Raring et al. |
| 9,014,229 B1 | 4/2015 | Raring et al. |
| 9,250,044 B1 | 2/2016 | Raring et al. |
| 9,800,017 B1 | 10/2017 | Raring et al. |
| 2001/0011935 A1 | 8/2001 | Lee et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2002/0189532 A1 | 12/2002 | Motoki et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0137265 A1* | 7/2004 | Shimada ............... C09K 11/06 428/690 |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0168564 A1 | 8/2005 | Kawaguchi et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0138431 A1 | 6/2006 | Dwilinski et al. |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0256559 A1* | 11/2006 | Bitar ........................ F41A 33/02 362/259 |
| 2006/0288928 A1 | 12/2006 | Eom et al. |
| 2007/0036186 A1 | 2/2007 | Corzine et al. |
| 2007/0039226 A1* | 2/2007 | Stokes .................... F41C 23/16 42/146 |
| 2007/0057337 A1 | 3/2007 | Kana et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0197004 A1 | 8/2007 | Dadgar et al. |
| 2007/0210074 A1 | 9/2007 | Maurer et al. |
| 2007/0210324 A1 | 9/2007 | Kawaguchi et al. |
| 2007/0215033 A1 | 9/2007 | Imaeda et al. |
| 2007/0217462 A1 | 9/2007 | Yamasaki |
| 2007/0218703 A1 | 9/2007 | Kaeding et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 | 2/2008 | Milshtein et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0092812 A1 | 4/2008 | McDiarmid et al. |

(56) References Cited

U.S. PATENT DOCUMENTS

| | | |
|---|---|---|
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0142779 A1 | 6/2008 | Yang |
| 2008/0149949 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0193363 A1 | 8/2008 | Tsuji |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St John-Larkin |
| 2009/0081857 A1 | 3/2009 | Hanser et al. |
| 2009/0081867 A1 | 3/2009 | Taguchi et al. |
| 2009/0092536 A1 | 4/2009 | Kawabata et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0218593 A1 | 9/2009 | Kamikawa et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0075175 A1 | 3/2010 | Poblenz et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140745 A1 | 6/2010 | Khan et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0304874 A1 | 12/2010 | Abatemarco |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0281422 A1 | 11/2011 | Wang et al. |
| 2011/0286484 A1 | 11/2011 | Raring et al. |
| 2012/0000415 A1 | 1/2012 | D'Evelyn et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178198 A1 | 7/2012 | Raring et al. |
| 2012/0187371 A1 | 7/2012 | Raring et al. |
| 2012/0199952 A1 | 9/2012 | D'Evelyn et al. |
| 2012/0248483 A1* | 10/2012 | Beppu ............... H01L 33/505 |
| | | 257/98 |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0119401 A1 | 5/2013 | D'Evelyn et al. |
| 2014/0079088 A1 | 3/2014 | Joseph |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 1171692 | 4/2008 |
| JP | 3-287770 | 12/1991 |
| JP | 07-162081 | 6/1995 |
| JP | 2002-185082 | 6/2002 |
| JP | 2002-009402 | 11/2002 |
| JP | 2004-186527 | 2/2004 |
| JP | 2004-152841 | 5/2004 |
| JP | 2004-503923 | 5/2004 |
| JP | 2005-289797 | 10/2005 |
| JP | 2006-091285 | 6/2006 |
| JP | 2006-120923 | 11/2006 |
| JP | 2007-173467 | 7/2007 |
| JP | 2007-529910 | 10/2007 |
| JP | 2007-068398 | 4/2008 |
| JP | 2008-311640 | 12/2008 |
| JP | 2009-021506 | 1/2009 |
| JP | 2009-158893 | 7/2009 |
| JP | 2009-170708 | 7/2009 |
| WO | 2006/057463 | 1/2006 |
| WO | 2007/004495 | 11/2007 |
| WO | 2008-041521 | 4/2008 |
| WO | 2010-068916 | 6/2010 |

(56) References Cited

FOREIGN PATENT DOCUMENTS

| WO | 2010/120819 | 10/2010 |
|---|---|---|
| WO | 2012/016033 | 2/2012 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Asif Khan "Cleaved cavity optically pumped InGaN-GaN laser grown on spinel substrates," Appl. Phys. Lett. 69 (16), pp. 2418-2420 (Oct. 14, 1996).
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Franssila, 'Tools for CVD and Epitaxys', Introduction to Microfabrication, 2004, pp. 329-336.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Gardner et al. "Blue-emitting InGaN-GaN double-heterostructure light-emitting diodes reaching maximum quantum efficiency above 200 A/ cm2", Applied Physics Letters 91, 243506 (2007).
Okubo, S., Nichia Develops Blue-green Semiconductor Laser w/ 488nm Wavelength, Jan. 22, 2008; http://techon.nikkeibp.co.jp/english/NEWS_EN/20080122/146009/?ST=english_PRINT, downloaded Jul. 3, 2018, 2 pages.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AIGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al " Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,",Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.

(56) References Cited

OTHER PUBLICATIONS

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion of PCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
Choi et al., 2.51 microcavity InGaN light-emitting diodes fabricated by a selective dry-etch thinning process', Applied Physics Letters, 2007, 91(6), 061120.
Fukuda et al., 'Prospects for the Ammonothermal Growth of Large GaN Crystal,' Journal of Crystal Growth, vol. 305, 2007, pp. 304-310.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum, Mar. 28, 2011, pp. 1.
Pattison et al., 'Gallium Nitride Based Microcavity Light Emitting Diodes With 2? Effective Cavity Thickness', Applied Physics Letters, vol. 90, Issue 3, 031111 (2007) 3 pg.
Sarva et al., 'Dynamic Compressive Strength of Silicon Carbide Under Uniaxial Compression,' Material Sciences and Engineering, vol. A317, 2001, pp. 140-144.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, I p. 1-19 (2004).
Altoukhov et al., 'High reflectivity airgap distributed Bragg reflectors realized by wet etching of AlInN sacrificial layers', Applied Physics Letters, vol. 95, 2009, pp. 191102-1-191102-3.
Callahan et al., 'Synthesis and Growth of Gallium Nitride by The Chemical Vapor Reaction Process (CVRP)', MRS Internet Journal Nitride Semiconductor Research, vol. 4, No. 10, 1999, pp. 1-6.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride-A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009,34, 5, pp. 313-317.
Gladkov et al., 'Effect of Fe doping on optical properties of freestanding semi-insulating HVPE GaN:Fe', Journal of Crystal Growth, 312,2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, 2005, pp. 103509-1-103509-4.
International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Wang et al., 'Ammonothermal Growth of GaN Crystals in Alkaline Solutions', Journal of Crystal Growth, vol. 287, 2006, pp. 376-380.
Non-Final Office Action dated Dec. 17, 2012 for U.S. Appl. No. 12/787,343, 8 pages.
Notice of Allowance dated Jun. 10, 2013, 2013 for U.S. Appl. No. 12/787,343, 12 pages.
Non-Final Office Action dated Oct. 7, 2013 for U.S. Appl. No. 13/752,158, 21 pages.
Notice of Allowance dated Nov. 27, 2013, 2013 for U.S. Appl. No. 13/937,981, 12 pages.
Notice of Allowance dated Mar. 28, 2014, 2014 for U.S. Appl. No. 13/937,981, 34 pages.
Final Office Action dated Apr. 1, 2014 for U.S. Appl. No. 13/752,158, 27 pages.
Notice of Allowance dated Sep. 16, 2014 for U.S. Appl. No. 13/752,158, 9 pages.
Non-Final Office Action dated Apr. 9, 2015 for U.S. Appl. No. 13/938,048, 10 pages.
Final Office Action dated Jul. 27, 2015 for U.S. Appl. No. 13/938,048, 5 pages.
Non-Final Office Action dated Sep. 6, 2017 for U.S. Appl. No. 14/984,108, 10 pages.
Notice of Allowance dated Sep. 30, 2015 for U.S. Appl. No. 13/938,048, 6 pages.
U.S. Appl. No. 14/984,108 Final Office Action dated Jan. 18, 2018, 12 pages.
U.S. Appl. No. 15/710,715 Notice of Allowance dated May 25, 2018, 17 pages.
U.S. Appl. No. 14/822,845 Non-Final Office Action dated Jan. 6, 2017, 17 pages.
U.S. Appl. No. 14/822,845 Final Office Action dated May 4, 2017, 15 pages.
U.S. Appl. No. 14/822,845 Notice of Allowance dated Jun. 21, 2017, 7 pages.

* cited by examiner

LASER DEVICE AND METHOD FOR A VEHICLE

CROSS-REFERENCE TO RELATED APPLICATION

This application is a continuation of U.S. application Ser. No. 15/710,715, filed Sep. 20, 2017, which is a continuation of U.S. application Ser. No. 14/822,845, filed Aug. 10, 2015, which is a continuation-in-part of U.S. application Ser. No. 13/938,048, filed Jul. 9, 2013, which is a continuation-in-part of U.S. application Ser. No. 12/787,343, filed May 25, 2010, which claims priority to U.S. Application No. 61/182,104, filed May 29, 2009, each of which is incorporated herein by reference in its entirety for all purposes.

BACKGROUND OF THE INVENTION

The present invention is related to laser devices. More specifically, examples of the present invention provide laser dazzling devices power by one or more green laser diodes characterized by a wavelength of about 500 nm to 540 nm. In various examples, laser dazzling devices include non-polar and/or semi-polar green laser diodes. In a specific example, a single laser dazzling device includes a plurality of green laser diodes, which may couple power together. There are other examples as well.

As human beings become more civilized, non-lethal techniques have been developed to temporarily halt others that may be dangerous or hostile. In any potentially hostile situation such as a military security checkpoint, a critical need exists to identify potentially threatening individuals or groups prior to undertaking an escalation of force. Non lethal threat detection and deterrent techniques are commonly used such as megaphones, tire spike strips, traffic cones, fencing, and hand gestures. However, many of these are impractical in impromptu security environments, and such measures may not show enough force to deter potentially hostile parties. If a serious threat is anticipated, historically, warning shots were fired, but this action can actually accelerate tensions and result in unwanted and unnecessary escalation of force if the shots are perceived incorrectly by the approaching party. Moreover, once the warning shots have been fired, a common next step in the escalation of force is to engage the approaching party directly with gunfire which dramatically increases the likelihood in loss of life.

As a result, an intermediate means of threat detection using bright light has been developed and employed called laser dazzling. This measure provides less than lethal threat detection, assessment, and an opportunity for de-escalation while at the same time providing a strong visual warning which can "dazzle" or induce temporary blindness to disorient approaching hostile parties without causing permanent ocular damage. End users of these tools include soldiers on the battlefield, homeland security officers, police, general security who find themselves in any potentially hostile situation.

An application of bright light for threat detection and deterrent goes back to early in the 20th century when soldiers used searchlights for this purpose. As lasers were developed in the 1960s, they became more portable, and by the 1980s, defense and security forces were using lasers as dazzlers because of their long range capability resulting from their collimated beam output. In the 1990s, the United Nations enacted the Protocol on Blinding Laser Weapons which outlawed weapons intended to cause permanent blindness, but which leave the door open to weapons which induce temporary blindness.

Laser dazzlers are a common tool in the defense and security market. They go by several names, including: laser dazzler, nonlethal visual disrupter, visual warning technology, nonlethal lasers, and others. In conventional laser dazzlers, green lasers are often employed. In order to generate the green laser light in the conventional laser dazzlers, a three stage laser is often required, typically referred to as a diode pumped solid state (DPSS) frequency doubled green laser. A conventional laser design typically includes:

A laser diode which outputs 808 nm laser light (typically powered by a battery)

The 808 nm laser is then focused into a solid state lasing crystal based on ND:YAG or Nd:Van. The crystals emit laser light at or near 1064 nm.

The 1064 nm is then incident on a frequency doubling crystal which creates green light through the second harmonic generation process where two 1064 nm photons are converted into a single 532 nm photon. The frequency doubling crystal is typically KTP, LBO, BBO, PPLN, or another similar material. While these conventional laser dazzling devices are functional, there are certain drawbacks. That is, conventional laser dazzlers are often complex and requires complex optics and configurations. Additionally, such laser dazzlers are also expensive and difficult to scale. These and other drawbacks are described throughout the present specification and more particularly below.

Therefore, it is to be appreciated that improved systems and method for laser dazzling devices are desirable.

BRIEF SUMMARY OF THE INVENTION

According to the present invention, laser devices are provided. More specifically, examples of the present invention provide laser dazzling or illumination devices power by one or more green laser diodes characterized by a wavelength of about 500 nm to 540 nm. In an example, the laser dazzling device is configured from a laser pumped phosphor (LPP). In such LPP applications the laser diodes are characterized by violet wavelengths of about 390 nm to about 425 nm or blue wavelengths of about 425 nm to about 480 nm. The laser beam from the laser diodes excites a phosphor material, which functions to convert the incident laser beam to longer wavelength emission such as green emission, yellow emission, or red emission. One or more of the emission colors from the laser diode and phosphor members comprises the dazzling electromagnetic radiation output from the illumination or dazzling device. In various examples, laser illumination or dazzling devices include polar, non-polar, and/or semi-polar green laser diodes. In a specific example, one or more blue or violet laser diodes is configured to excite a green phosphor and emit a green emission from the phosphor. In a specific example, a single laser dazzling device includes a plurality of green laser diodes. There are other examples as well.

Specifically, since the laser diodes output beams carrying over 1 W, over 5 W, over 10 W, or even over 100 W can be focused to very small spot sizes of less than 2 mm in diameter, less than 1 mm in diameter, less than 500 microns in diameter, less than 100 microns in diameter, or even less than 50 microns in diameter, power densities of over 1 W/mm2, 100 W/mm2, or even over 2,500 W/mm2 can be achieved. When this very small and powerful beam of laser excitation light is incident on a phosphor material an extremely bright spot or point source of light can be achieved from the phosphor. Based on the choice of phosphor color emission and laser color emission, the bright spot can be comprised of several colors including green, blue, red, or white. Assuming an example combining a yellow phosphor with a blue laser diode to form a white light wherein the phosphor conversion ratio is 200 lumens of emitted white light per optical watt of excitation light, a 5 W excitation power could generate 1000 lumens in a beam diameter of 100 microns, or 50 microns, or less. This unprecedented source brightness can be game changing in dazzling applications, spotlighting applications, and range finding applications when collimating optics such as parabolic reflectors or lensing optics are combined with the source to create highly collimated green, red, blue, or white spot lights traveling distances than ever possible before using LEDs or bulb technology.

In a specific example, the present invention includes certain features for a laser dazzler as defined below:

Wavelength: Dazzlers are configured to output green light since the eye is most sensitive to green wavelengths. Specifically, for the same amount of optical power, the human eye is typically more than 5 times more sensitive to green light as compared to red or blue light in daylight conditions.

Power: Dazzlers output optical power ranges from 5 mW to 500 mW, depending on the range. It is noted that these power levels exceed the FDA's eye-safe power of a laser pointer (5 mW). As a result, the dazzler may be specified with a Nominal Ocular Hazard Distance (NOHD) which is the distance under which one can potentially cause eye injuries if used on anyone up to that distance. For example a dazzler may have an NOHD of 45 meters. In other examples, the dazzler device may have an optical output power of greater than 1 W or greater than 10 W.

In addition to the laser and phosphor members, other features include telescoping optics to collimate the beam to a large or small spot at a given range, batteries, mechanics for handheld operation and integration with small arms, sighting, etc.

Minimal power consumption in order to minimize size, cost, weight of the batter and of the thermal management required Ruggedness over temperature, shock, vibration Compact size Lightweight Low cost Of course, there may be other variations, alternatives, and modifications.

According to an example, the present invention provides a laser dazzling apparatus. The laser dazzling apparatus includes a housing member. The laser dazzling device includes a laser device. The laser device comprises at least a gallium and nitrogen containing device having an active region and a cavity member. The laser device is configured to emit a laser beam having a wavelength about 500 nm to 540 nm. The active regions include gallium nitride material, the laser beam being characterized by a first direction. The laser dazzling device includes a driving circuit electrically coupled to the laser device. The driving circuit is adapted to deliver electrical energy to the laser device. The electrical energy is less than 800 mW, but can be others such as greater than 1 W, 5 W, or 10 W. The laser dazzling device includes a power source electrically coupled to the driving circuit. The laser dazzling device includes an activation module electrically coupled to the driving circuit. The activation module is configured to send an activation signal to the driving circuit, which electrifies the laser diode and generates an output laser beam. The output laser beam is typically coupled into optical members for beam collimation and/or beam shaping and is then directed out of the dazzling device to the environment and configured for dazzling. The laser dazzling device includes a sight for aligning the laser beam to a desired position.

In an alternative examples, the present invention provides a laser pumped phosphor dazzling apparatus. The laser pumped phosphor dazzling apparatus includes a housing member. The laser pumped phosphor dazzling device includes a laser device. The laser device comprises at least a gallium and nitrogen containing device having an active region and a cavity member. The laser device is configured to emit a laser beam having a wavelength about 390 nm to about 480 nm. The active regions include a gallium and nitrogen containing material, the laser beam being characterized by a first direction. The laser dazzling device includes a driving circuit electrically coupled to the laser device. The driving circuit is adapted to deliver electrical energy to the laser device. The electrical energy is less than 800 mW, but can be others such as greater than 1 W, greater than 5 W, or greater than 10 W. The laser pumped phosphor dazzling device includes a power source electrically coupled to the driving circuit. The laser pumped phosphor dazzling device includes an activation module electrically coupled to the driving circuit. The activation module is configured to send an activation signal to the driving circuit, which electrifies the laser diode and generates an output laser beam. The output laser beam is optically coupled to one or more phosphor members. In some examples, the laser beam is shaped or collimated with optics prior to incidence on the phosphor. In some examples, turning mirrors or dichroic mirrors are configured to direct the laser beam and phosphor emission. The laser beam is configured to excite the one or more phosphor member wherein the phosphor member absorbs at least some of the radiation in the laser beam and converts it to a second wavelength such as green in the 500 to 550 nm range. The phosphor emission is typically coupled into optical members for beam collimation and/or beam shaping and is then directed out of the dazzling device to the environment and configured for dazzling. The laser dazzling device includes a sight for aligning the laser beam to a desired position.

In other examples more than one laser diode can be used and phosphor members with different colors can be used. In some examples, multiple phosphors can be used for a multi-color a variable color emission. In one preferred example, the dazzling device can be configured to dynamically change the laser beam and phosphor member coupling characteristic such that the user can select different dazzling device output colors. In one example, the dazzling device is configured to emit a green dazzling emission and a white dazzling or spot lighting emission in which the user can select.

According to another example, the present invention provides a laser pumped phosphor dazzling device. The laser pumped phosphor dazzling device includes at least one laser device and at least one phosphor member. The laser device comprises a first wavelength selected from a violet wavelength in the 390 nm to 425 nm range or a blue wavelength in the 425 nm to 480 nm range. The laser diode comprises an active region and a cavity member. The laser diode is configured to emit a laser beam at an intensity level of less than 800 mW, but can be others such as greater than 1 W, greater than 5 W, or greater than 10 W. The active region includes a gallium and nitrogen containing material. The laser beam is characterized by a first direction. The laser dazzling device includes a driving circuit electrically coupled to the laser device. The driving circuit is adapted to deliver electrical energy to the laser device. The electrical energy is less than 800 mW, but can be others such as greater than 1 W, greater than 5 W, or greater than 10 W. The laser dazzling device includes a power source electrically coupled to the driving circuit. The laser dazzling device includes an activation module electrically coupled to the driving circuit. The activation module is configured to send an activation signal to the driving circuit, the activation module comprising an electrical trigger. When the trigger is activated, laser diode is electrified and generates an output laser beam. The output laser beam is optically coupled to one or more phosphor members. In some examples, the laser beam is shaped or collimated with optics prior to incidence on the phosphor. In some examples, turning mirrors or dichroic mirrors are configured to direct the laser beam and phosphor emission. The laser beam is configured to excite the one or more phosphor member wherein the phosphor member absorbs at least some of the radiation in the laser beam and converts it to a second wavelength such as green in the 500 to 550 nm range. The phosphor emission is typically coupled into optical members for beam collimation and/or beam shaping and is then directed out of the dazzling device to the environment and configured for dazzling. The laser dazzling device includes a sight for aligning the laser beam to a desired position. In an alternative specific example, the present invention provides a laser dazzler apparatus. The laser dazzler apparatus includes a laser device including a laser diode a phosphor member. In other examples more than one laser diode can be used and phosphor members with different colors can be used. In some examples, multiple phosphors can be used for a multi-color a variable color emission. In one preferred example, the dazzling device can be configured to dynamically change the laser beam and phosphor member coupling characteristic such that the user can select different dazzling device output colors. In one example, the dazzling device is configured to emit a green dazzling emission and a white dazzling or spot lighting emission in which the user can select.

According to another example, the present invention provides a laser dazzling device. The laser dazzling device includes a laser device. The laser device comprises a green laser diode. The green laser diode comprises an active region and a cavity member. The green laser diode is configured to emit a laser beam at an intensity level of less than 800 mW, but can be others such as greater than 1 W, greater than 5 W, or greater than 10 W. The active regions includes a gallium and nitrogen containing material. The laser beam is characterized by a first direction. The laser dazzling device includes a driving circuit electrically coupled to the laser device. The driving circuit is adapted to deliver electrical energy to the laser device. The electrical energy is less than 800 mW, but can be others such as greater than 1 W, greater than 5 W, or greater than 10 W. The laser dazzling device includes a power source electrically coupled to the driving circuit. The laser dazzling device includes an activation module electrically coupled to the driving circuit. The activation module is configured to send an activation signal to the driving circuit, the activation module comprising an electrical trigger. The laser dazzling device includes a sight for aligning the laser beam to a desired position. In an alternative specific example, the present invention provides a laser dazzler apparatus. The laser dazzler apparatus includes a laser device including a laser diode. The laser diode comprises a gallium and nitrogen containing substrate configured in a semi-polar orientation in one or more examples. The laser diode is configured to emit a laser beam characterized by at least a wavelength of about 490 nm to 540 nm according to a specific example. The apparatus includes a power source electrically coupled to the laser device in a specific example.

It is to be appreciated that examples of the present invention provides numerous advantages over conventional techniques. According to the present invention, a laser dazzling device implemented using one or more violet, blue, or green laser diodes based on GaN coupled to phosphor member has the numerous advantages over existing DPSS approaches.

Efficiency: Because the GaN diode laser is a single stage, it is inherently more efficient and therefore requires less powerful batteries, decreasing the size, weight and cost. Moreover, the efficient generation of light minimizes waste heat which needs to be managed and carried away which further reduces size, weight, and cost.

Ruggedness and elimination of alignment: The green laser light is generated within the chip, so external optical alignment is not required to maintain lasing. This dramatically reduces cost in the manufacturing process and also eliminates failure mechanisms for the use in the field.

Broad temperature operation: The GaN diode laser approach is not sensitive to minor changes in temperature. Therefore, requirements for several control are eliminated including sensors for temperature and/or light, along with active temperature controls such as heaters or thermoelectric coolers. This greatly reduces the system complexity, cost, size, and weight, and eliminates failure mechanisms.

Elimination of the dangerous of the residual 1064 nm beam: This GaN design produces only a green laser beam and does not produce a 1064 nm beam. This eliminates the blocking filter reducing cost, and eliminating the risk of emitting an extremely dangerous infrared beam.

Design flexibility in wavelength: By using the GaN approach, it is possible to achieve a slightly different wavelength such as 515 nm or 500 nm from the device in examples where direct emission is used for dazzling. Such flexibility is important for dazzlers designed for dark environments, where the eye's sensitivity shifts and 500 nm is actually 20% brighter to the eye than light at 530 nm. Moreover, the flexible design enables one to fabricate a slightly different green wavelength which may be useful in preventing hostile parties from using 532 nm narrow band filter to avoid the effect of dazzling. In examples using a GaN laser pumped phosphor approach wavelength selectivity can be a dynamic feature in the dazzling device. That is, a violet or blue laser diode can be configured to have a changing optical coupling to phosphor members of different colors in the dazzling device. For example, a blue laser diode beam can be configured to excite a green phosphor and emit a green dazzling output. With mechanical or electromechanical features such as mirrors that can be moved or rotated, the blue laser diode beam can be directed toward a yellow phosphor wherein the blue emission from the laser diode and the yellow emission from the phosphor would create a white light. In an alternative approach the dynamic output color dazzling device, the optical coupling configuration can be altered by moving or rotating the phosphor members such that the laser beam stays fixed, but the phosphor in the laser beam path is changed or altered to create a different color or output characteristic.

According to specific examples, green laser diodes (using nonpolar and/or semipolar GaN) or laser diode plus phosphor members are used for non lethal threat detection, threat assessment, threat de-escalation, visual warning technology, and laser dazzling are provided.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
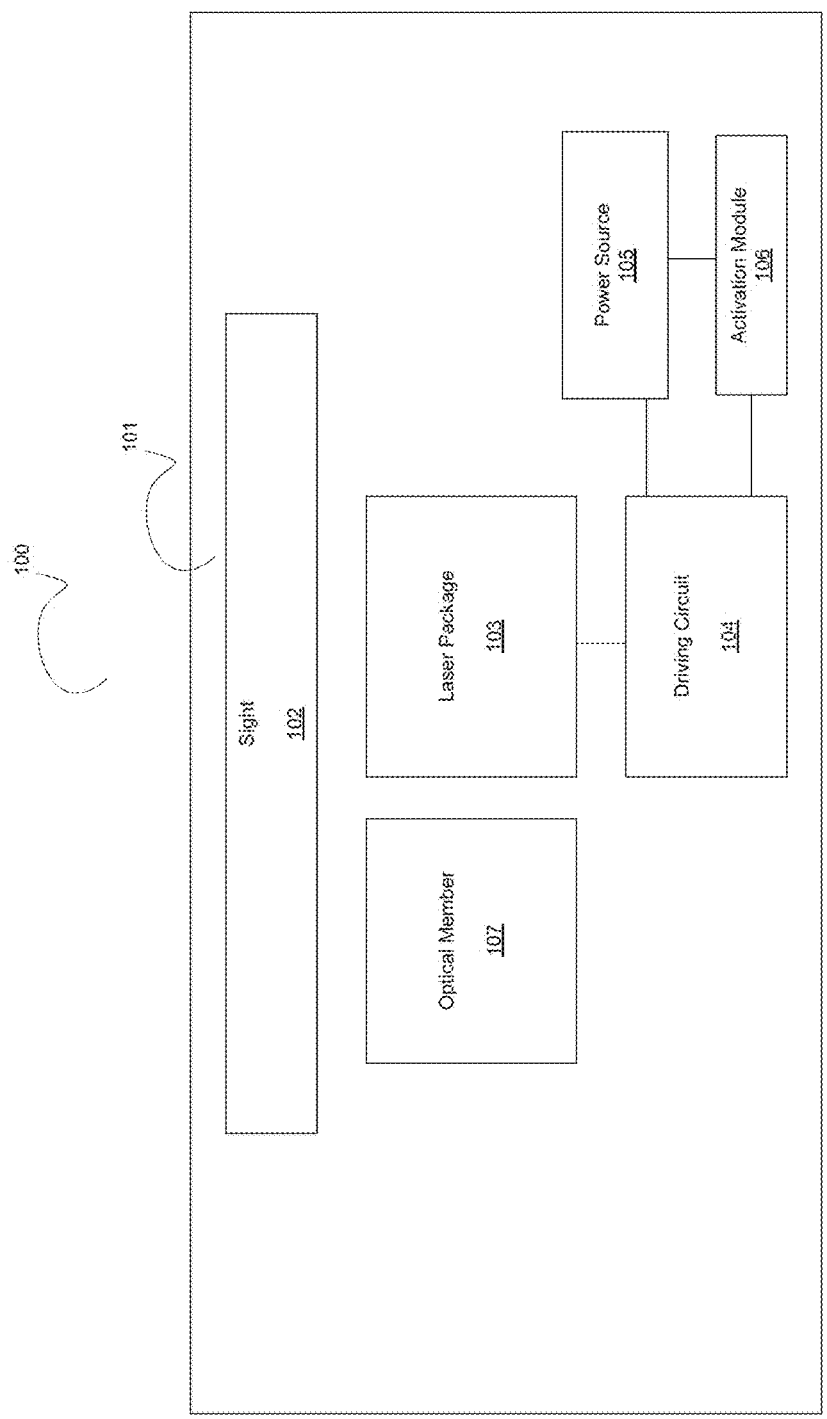
FIG. 1 is a simplified block diagram illustrating a laser dazzling device according to an example of the present invention.

According to the present invention, laser devices are provided. More specifically, examples of the present invention provide laser dazzling devices power by one or more green laser diodes characterized by a wavelength of about 500 nm to 540 nm. In preferable examples, the laser dazzling device is configured from a laser pumped phosphor (LPP). In such LPP applications the laser diodes are characterized by violet wavelengths of about 390 nm to about 425 nm or blue wavelengths of about 425 nm to about 480 nm. The laser beam from the laser diodes excites a phosphor material, which functions to convert the incident laser beam to longer wavelength emission such as green emission, yellow emission, or red emission. One or more of the emission colors from the laser diode and phosphor members comprises the dazzling electromagnetic radiation output from the dazzling device. In various examples, laser dazzling devices include polar, non-polar, and/or semi-polar green laser diodes. In a specific example, one or more blue or violet laser diodes is configured to excite a green phosphor and emit a green emission from the phosphor. a single laser dazzling device includes a plurality of green laser diodes. In a specific example, a single laser dazzling device includes a plurality of green laser diodes. There are other examples as well.

Specifically, since the laser diodes output beams carrying over 1 W, over 5 W, over 10 W, or even over 100 W can be focused to very small spot sizes of less than 2 mm in diameter, less than 1 mm in diameter, less than 500 microns in diameter, less than 100 microns in diameter, or even less than 50 microns in diameter, power densities of over 1 W/mm2, 100 W/mm2, or even over 2,500 W/mm2 can be achieved. When this very small and powerful beam of laser excitation light is incident on a phosphor material an extremely bright spot or point source of light can be achieved from the phosphor. Based on the choice of phosphor color emission and laser color emission, the bright spot can be comprised of several colors including green, blue, red, or white. Assuming an example combining a yellow phosphor with a blue laser diode to form a white light wherein the phosphor conversion ratio is 200 lumens of emitted white light per optical watt of excitation light, a 5 W excitation power could generate 1000 lumens in a beam diameter of 100 microns, or 50 microns, or less. This unprecedented source brightness can be game changing in dazzling applications, spotlighting applications, and range finding applications when collimating optics such as parabolic reflectors or lensing optics are combined with the source to create highly collimated green, red, blue, or white spot lights traveling distances than ever possible before using LEDs or bulb technology.

As described above, conventional laser devices are often inadequate for various reasons. More specifically, conventional DPPS laser devices are often inefficient. Although the three stage DPSS lasers do generate green laser light for the application today, several critical limitations of this design are noted below:

Inefficiency: Because each of the 3 processes is not perfectly efficient and has inherent loss, these green DPSS lasers are inefficient and therefore require powerful batteries to drive them, increasing the size, weight and cost. Moreover, the inefficient generation of light results in waste heat which needs to be managed and carried away which adds to the bulk and expense.

Fragility and sensitivity to alignment: In is absolutely critical to align each of the beams and crystals and optics with respect to one another in order to generate the green light. If misalignment occurs in assembly or in application, the green laser light generation will cease altogether. This adds cost in the manufacturing process and also presents failure mechanisms for the use in the field.

Temperature sensitivity: in order to achieve the 808 nm conversion to 1064 nm and the 1064 nm conversion to 532 nm, the temperature of the diode laser and/or crystals need to be precisely controlled. Minor changes in temperature beyond a few degrees C. can cause the green light generation process to decrease substantially or cease altogether. In order to overcome this, sensors for temperature and/or light, along with active temperature controls such as heaters or thermoelectric coolers are employed to maintain lasing in the green. These measures add to the systems cost, size, and weight, and present additional failure mechanisms.

Danger of the residual 1064 nm beam: This DPSS design produces a 1064 nm laser beam with power several times that of the green beam. While some of this light is converted to the green, residual 1064 nm laser light is inherent in the system since the frequency conversion process is not perfect. This residual infrared laser beam is typically blocked by the manufacturer using a filter which adds cost. If the filter were somehow to fail and the residual 1064 nm beam was emitted, the 1064 nm beam would be extremely dangerous because it is invisible to the human eye and may have enough power to cause blindness.

Fixed wavelength at 532 nm prevents flexible designs: Use of the DPSS approach results in a single wavelength output that is a property of the crystals used. It is not possible to achieve a slightly different wavelength such as 515 nm or 500 nm from the device unless another crystal would be invented. Such flexibility would be attractive since, in dark environments, the eye's sensitivity shifts and light at a wavelength of 500 nm is actually 20% brighter to the eye than light at 530 nm. Moreover, hostile parties may attempt to use narrow band filters to avoid the effect of dazzling, and using a slightly different green wavelength may be needed in the future.

In various examples, the present invention provide laser dazzling devices implemented using green laser diodes that directly produces green laser beams. In alternative examples, the present invention provide laser dazzling devices implemented using violet or blue laser diodes that directly produces violet or blue laser beams that subsequently excite a phosphor member to create a green emission for an output green beam. More specifically, by utilizing a GaN diode laser that directly produces a laser beam from a single stage design, one can efficiently produce a green beam from a tiny laser chip and eliminate or mitigate these drawbacks to existing DPSS systems in the field of laser dazzlers. According to the present invention, a green laser diode based on GaN technology or a violet or blue laser diode based on GaN technology coupled to a phosphor member would have the following advantages over existing DPSS approaches:

Efficiency: Because the GaN diode laser is a single stage, it is inherently more efficient and therefore requires less powerful batteries, decreasing the size, weight and cost. Moreover, the efficient generation of light minimizes waste heat which needs to be managed and carried away which further reduces size, weight, and cost. In the green phosphor converted examples, the phosphor members can be highly efficient, exhibit minimal temperature dependence, compact, and light weight.

Ruggedness and elimination of alignment: In the direct green diode example, the green laser light is generated within the chip, so external optical alignment is not required to maintain lasing. This dramatically reduces cost in the manufacturing process and also eliminates failure mechanisms for the use in the field. In the green phosphor converted examples, the phosphor members can efficiency can be configured to be rugged and compact with large tolerance for beam characteristic differences such that high tolerance alignments are not crucial.

Broad temperature operation: The GaN diode laser approach is not sensitive to minor changes in temperature. Therefore, requirements for several control are eliminated including sensors for temperature and/or light, along with active temperature controls such as heaters or thermoelectric coolers. This greatly reduces the system complexity, cost, size, and weight, and eliminates failure mechanisms. In the green phosphor converted examples, the phosphor members can maintain efficiency up to temperatures greater than 100 C, 150 C, 200 C, and even 250 C.

Elimination of the dangerous of the residual 1064 nm beam: This GaN design produces only a green laser beam and does not produce a 1064 nm beam. This eliminates the blocking filter reducing cost, and eliminating the risk of emitting an extremely dangerous infrared beam.

Design flexibility in wavelength: By using the GaN approach, it is possible to achieve a slightly different wavelength such as 515 nm or 500 nm from the device. Such flexibility is important for dazzlers designed for dark environments, where the eye's sensitivity shifts and 500 nm is actually 20% brighter to the eye than light at 530 nm. Moreover, the flexible design enables one to fabricate a slightly different green wavelength which may be useful in preventing hostile parties from using 532 nm narrow band filter to avoid the effect of dazzling. In examples using a GaN laser diode pumped phosphor approach wavelength selectivity can be a dynamic feature in the dazzling device. That is, a violet or blue laser diode can be configured to have a changing optical coupling to phosphor members of different colors in the dazzling device. For example, a blue laser diode beam can be configured to excite a green phosphor and emit a green dazzling output. With mechanical or electromechanical features such as mirrors that can be moved or rotated, the blue laser diode beam can be directed toward a yellow phosphor wherein the blue emission from the laser diode and the yellow emission from the phosphor would create a white light. In an alternative approach the dynamic output color dazzling device, the optical coupling configuration can be altered by moving or rotating the phosphor members such that the laser beam stays fixed, but the phosphor in the laser beam path is changed or altered to create a different color or output characteristic.

FIG. 1 is a simplified block diagram illustrating a laser dazzling device according to an example of the present invention. This diagram is merely an example, which should not unduly limit the scope of the claims herein. One of ordinary skill in the art would recognize other variations, modifications, and alternatives. As shown in FIG. 1, a laser dazzling device 100 includes a housing 101, a sight 102, a laser device 103, a driving circuit 104, a power source 105, an activation module 106, and an optical member 107. It is be appreciated that there can be other components as well.

The housing member 101 provides an enclosure for the components of the laser dazzling device. Depending on the specific application, the housing member 101 may be in various types of shapes. For example, the housing member 101 can be shaped like a pistol and includes a pistol grip. Alternative, the housing member 101 can be shaped like a rifle and comprises a rifle stock. Additionally, the housing member can be attached to vehicle mount and/or include tripod.

The laser device 103 according to examples of the present invention include one or more laser diodes that directly emit green laser beam without using frequency alteration (e.g., frequency double or DPSS) techniques. In a specific example, the laser device includes a green laser diode that includes an active region and a cavity member. The green laser diode is configured to emit a laser beam having a wavelength about 500 nm to 540 nm. In a specific example, the wavelength is about 532 nm. The active region of the green laser diode includes gallium nitride material. For example, the green laser diode includes a mirror surface where the laser beam is emitted, and the laser beam is characterized by a first direction. Depending on the application, the green laser diode can be associated with one or more operational modes. For example, each of the operational modes is associated with an operating frequency.

In one example, the laser device 103 comprises a plurality of green laser diodes sharing a single substrate. For example, the green laser diodes are monolithically integrated during the manufacturing process of the green laser diode, as is described below. By using a plurality of green laser diodes, the power level of the laser dazzling device can be increased. For example, a high power laser device having a plurality of green laser diodes is used for high-power military laser dazzling systems wherein the laser beams are used to disable weapons sensors. Alternatively, the laser device 103 comprises a plurality of green laser diodes sharing a single package.

According to various examples of the present invention, the green laser diode can be semi-polar or non-polar. For example, green laser diodes are fabricated from a bulk substrate. Since the green laser diodes directly emit laser beam in green wavelength range, the laser dazzling device is free from a frequency doubling crystal.

In many instances, the output power level of laser dazzling device needs to be limited to avoid permanent injury to eyes. In a specific example, the laser beam is characterized by an energy level of less than 500 mW.

The driving circuit 104 is electrically coupled to the laser device 103. Among other things, the driving circuit 104 is specifically adapted to deliver electrical energy to the laser device. For example, the electrical energy can less than 800 mW. The driving circuit 104 may deliver electrically energy to the laser device 103 in various ways. In one example, the driving circuit is adapted to deliver electrical energy to the laser device in pulses.

The power source 105 is electrically coupled to the driving circuit. For example, the power source comprises a battery. The battery may be rechargeable or disposable. For example, NiMH or LiON rechargeable battery is used for the power source.

The activation module 106 is electrically coupled to the driving circuit. The activation module is configured to send an activation signal to the driving circuit. For example, an operator is able to cause the driving circuit to provide electrical energy to the laser device, which in response emit a laser beam. In one example, the activation module is configured like a traditional trigger unit, which includes a trigger and a safety.

The sight 102 is provided for aligning the laser beam to a desired position. Depending on the application, the sight can be an open sight, an aperture sight, a red dot sight, a hologram sight, and/or a scope.

The optical member 107 is used to focus the laser beam. In an example, the optical member 107 is positioned within vicinity the emitting portion of the laser device. For example, the optical member 107 includes collimation lens and telescope to collimate and size the laser beam. In one example, the optical member 107 includes an optical concentrator aligned with the laser device. In another example, the optical member comprises waveguide for projecting the laser beam along the first direction.

Figure 1A:
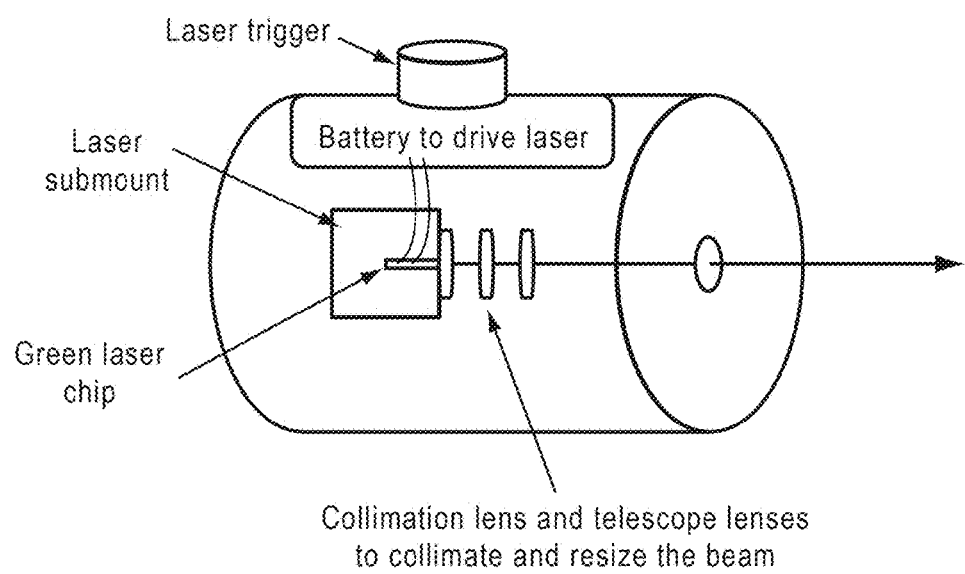
FIG. 1A is a simplified diagram illustrating an alternative laser dazzling device according to an example of the present invention.

As mentioned above, various components of the laser dazzling device 100 may be added, removed, modified, and/or replaced. FIG. 1A is a simplified diagram illustrating an alternative laser dazzling device according to an example of the present invention. FIG. 1A shows a laser trigger that can be manually attached to the laser housing or wired out to another trigger elsewhere. Frequently dazzlers are bolted onto weapons, similar to the way a scope is mounted. This diagram is merely an example, which should not unduly limit the scope of the claims herein. One of ordinary skill in the art would recognize other variations, modifications, and alternatives.

Figure 2A:
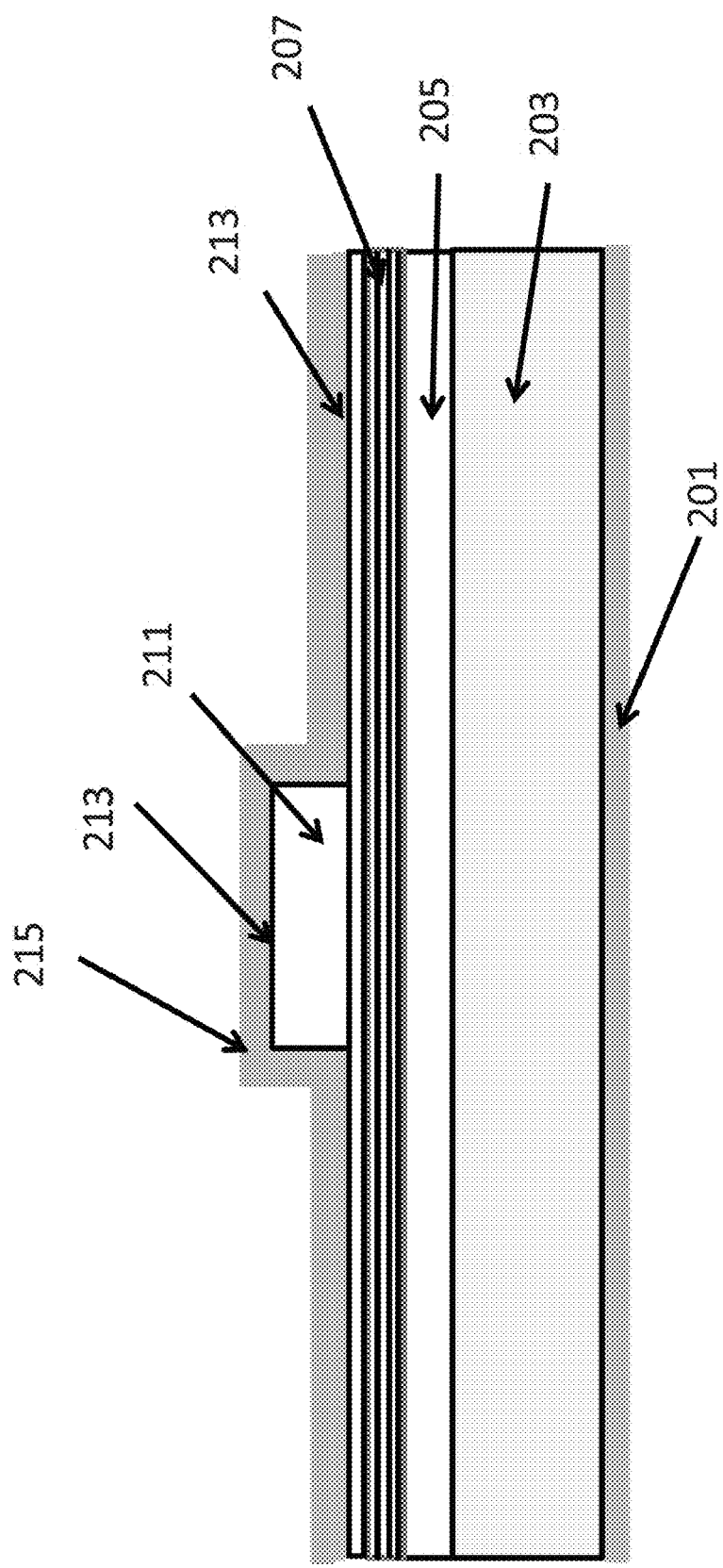
FIG. 2A is a detailed cross-sectional view of a laser device 200 fabricated on a {20-21} substrate according to an example of the present invention.

As mentioned above, the laser dazzling devices according to the present invention utilizes green laser diodes. FIG. 2A is a detailed cross-sectional view of a laser device 200 fabricated on a {20-21} substrate according to an example of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific example, the metal back contact region is made of a suitable material such as those noted below and others. Further details of the contact region can be found throughout the present specification and more particularly below.

In a specific example, the device also has an overlying n-type gallium nitride layer 205, an active region 207, and an overlying p-type gallium nitride layer structured as a laser stripe region 209. In a specific example, each of these regions is formed using at least an epitaxial deposition technique of metal organic chemical vapor deposition (MOCVD), molecular beam epitaxy (MBE), or other epitaxial growth techniques suitable for GaN growth. In a specific example, the epitaxial layer is a high quality epitaxial layer overlying the n-type gallium nitride layer. In some examples the high quality layer is doped, for example, with Si or O to form n-type material, with a dopant concentration between about $10^{16}$ cm$^{-3}$ and $10^{20}$ cm$^{-3}$.

In a specific example, an n-type $Al_uIn_vGa_{1-u-v}N$ layer, where $0 \leq u$, $v$, $u+v \leq 1$, is deposited on the substrate. In a specific example, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific example, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific example, the laser stripe region is made of the p-type gallium nitride layer 209. In a specific example, the laser stripe is provided by an etching process selected from dry etching or wet etching. In a preferred example, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific example, the dielectric region is an oxide such as silicon dioxide or silicon nitride, but can be others. The contact region is coupled to an overlying metal layer 215. The overlying metal layer is a multilayered structure containing gold and platinum (Pt/Au), nickel gold (Ni/Au), but can be others. Of course, there can be other variations, modifications, and alternatives.

In a specific example, the laser device has active region 207. The active region can include one to twenty quantum well regions according to one or more examples. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other examples, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific example, the active region can also include an electron blocking region, and a separate confinement heterostructure. In some examples, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific example, the electron blocking layer comprises AlGaN. In another example, the electron blocking layer comprises an AlGaN/GaN super-lattice structure, comprising alternating layers of AlGaN and GaN, each with a thickness between about 0.2 nm and about 5 nm. In Of course, there can be other variations, modifications, and alternatives.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific example, the laser stripe is provided by an etching process selected from dry etching or wet etching. In a preferred example, the etching process is dry, but can be others. The device also has an overlying dielectric region, which exposes 213 contact region. In a specific example, the dielectric region is an oxide such as silicon dioxide, but can be others. Of course, there can be other variations, modifications, and alternatives.

According to an example, the as-grown material gain peak is varied spatially across a wafer. As a result, different wavelength and/or color can be obtained from one fabricated laser to the next laser on the same wafer. The as-grown gain peak wavelength can be shifted using various methods according to examples of the present invention. According to one example, the present invention utilizes growth non-uniformities where the as-grown material has an emission wavelength gradient. For example, the growth non-uniformity can be obtained a result of temperature and/or growth rate gradients in the light emitting layers in the epitaxial growth chamber. For example, such wavelength gradients can be intentional or non-intentional, and the differences in wavelengths range from 10 to 40 nm deviation. For example, this method enables multiple lasers on the same chip to operate at different wavelengths.

In a specific example, an optical device configured to provide laser beams at different wavelengths is provided. The device includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}). The device also includes an active region comprising a barrier layer and a light emission layer, the light emission layer being characterized by a graduated profile associated with a peak emission wavelength gradient, the peak emission wavelength gradient having a deviation of at least 10 nm. Also, the device includes a first cavity member overlaying a first portion of the emission layer, the first portion of the emission layer being associated with a first wavelength, the first cavity member being characterized by a length of at least 100 um and a width of at least 0.5 um, the first cavity member being adapted to emit a first laser beam at the first wavelength. The device further includes a second cavity member overlaying a second portion of the emission layer, the second portion of the emission layer being associated with a second wavelength, a difference between the first and second wavelengths being at least 50 nm, the second cavity member being characterized by a length of at least 100 um and a width of at least 0.5 um, the second cavity member being adapted to emit a second laser beam at a second wavelength. Additionally, the device includes an output region wherein the first laser beam and the second laser beam are combined.

Figure 2B:
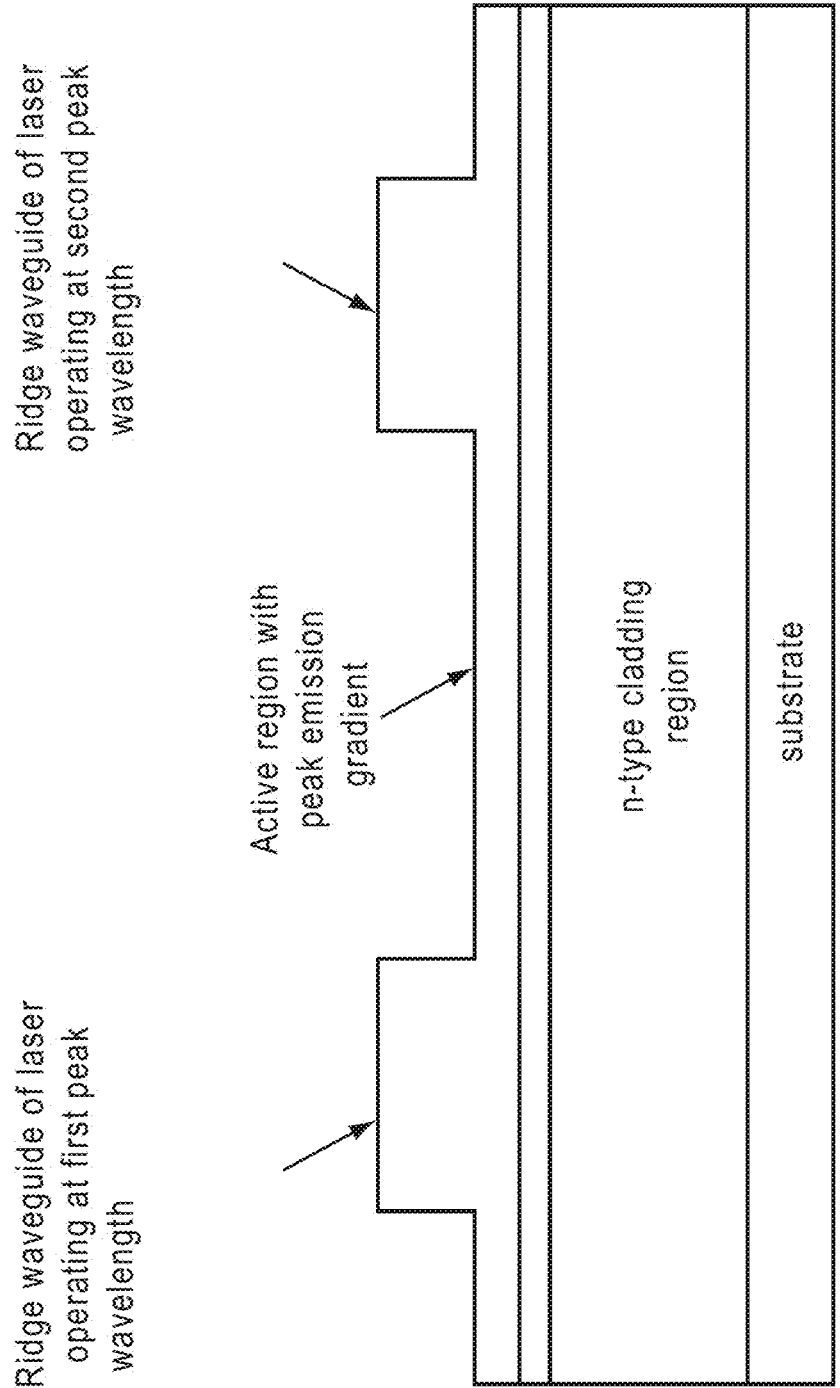
FIG. 2B is a simplified diagram illustrating a cross-section of an active region with graded emission wavelength.

As mentioned above, a laser dazzling device may include multiple green laser diodes for various purposes, such as increased power level, varying wavelength, and others. FIG. 2B is a simplified diagram illustrating a cross-section of an active region with graded emission wavelength. FIG. 2B shows a substrate, an n-type cladding region overlying the substrate, an active region characterized by a peak emission gradient overlying the n-type cladding region, and the two ridge waveguide lasers overlying the active region. Each of the ridge waveguide lasers operates at a peak wavelength determined by the cavity position relative to the emission wavelength of the graded active region. This diagram is merely an example, which should not unduly limit the scope of the claims. One of ordinary skill in the art would recognize many variations, alternatives, and modifications.

In certain examples of the present invention, multiple laser wavelengths output is obtained by manipulating the as-grown gain peak through selective area epitaxy (SAE), where dielectric patterns are used to define the growth area and modify the composition of the light emitting layers. Among other things, such modification of the composition can be used to cause different gain peak wavelengths and hence different lasing wavelengths. For example, by using SAE processes, a device designer can have a high degree of spatial control and can safely achieve 10-30 nm, and sometimes even more, of wavelength variation over the lasers. For example, the SAE process is described in a U.S. patent application Ser. No. 12/484,924, filed Jun. 15, 2009, entitled "SELECTIVE AREA EPITAXY GROWTH METHOD AND STRUCTURE FOR MULTI-COLOR DEVICES".

For example, this method enables multiple lasers on the same chip to operate at different wavelengths.

In a specific example, a laser apparatus manufactured using SAE process with multiple wavelengths and/or color is provided. The laser apparatus includes a gallium and nitrogen containing substrate including a first crystalline surface region orientation. The apparatus also includes an active region comprising a barrier layer and a plurality of light emission layers, the plurality of light emission layers including a first emission layer and a second emission layer, the first emission layer being characterized by a first wavelength, the second emission layer being characterized by a second wavelength, a difference between the first wavelength and the second wavelength is at least 10 nm. For example, the first and second emission layers are formed using selective area epitaxy processes.

The apparatus includes a first cavity member overlaying the first emission layer, the first cavity member being characterized by a length of at least 100 um and a width of at least 0.5 um, the first cavity member being adapted to emit a first laser beam at the first wavelength. The apparatus also includes a second cavity member overlaying the second the emission layer, the second cavity member being characterized by a length of at least 100 um and a width of at least 0.5 um the second cavity member being adapted to emit a second laser beam at the second wavelength. The apparatus additionally includes an output region wherein the first laser beam and the second laser beam are combined.

As explained above, it is often desirable to combine the first and second wavelengths or colors associated thereof for various applications. For example, the apparatus may have optics having dichroic coatings for combining the first and the second laser beam. In one example, the apparatus includes a plurality of polarizing optics for combining the first and the second laser beam. In a specific example, the first cavity member and the second cavity member share a common cleaved facet of mirror edges, which is configured to combine the first and second laser beams.

The first and second laser beams can be associated with a number of color combinations. For example, the first wavelength is associated with a green color and the second wavelength is associated with a blue color.

It is to be appreciated that the laser apparatus can be implemented on various types of substrates. For example, the first crystalline surface region orientation can be a {20-21} plane, and first crystalline surface region orientation can also be a {30-31} plane.

The laser apparatus may also include other structures, such as a surface ridge architecture, a buried heterostructure architecture, and/or a plurality of metal electrodes for selectively exciting the active region For example, the active region comprises a first and second gallium and nitrogen containing cladding layers and an indium and gallium containing emitting layer positioned between the first and second cladding layers. The laser apparatus may further includes an n-type gallium and nitrogen containing material and an n-type cladding material overlaying the n-type gallium and nitrogen containing material.

In certain examples of the present invention, multiple laser wavelengths and/or colors are obtained by providing multiple active regions, and each of the active regions is associated with a specific wavelength (or color). More specifically, multiple growth of active regions is performed across a single chip. In this technique a wafer is loaded in a growth chamber for the growth of an active region with one gain peak. After this growth, the wafer is subjected to one or more lithography and processing steps to remove a portion of the active region in some areas of the wafer. The wafer would then be subjected to a second growth where a second active region with a second peak gain wavelength is grown. Depending on the specific need, the processes of growing and removing active regions can be repeated many times. Eventually, be followed by the fabrication of laser diodes strategically positioned relative to these different active regions to enable lasing at various wavelengths.

Figure 2C:
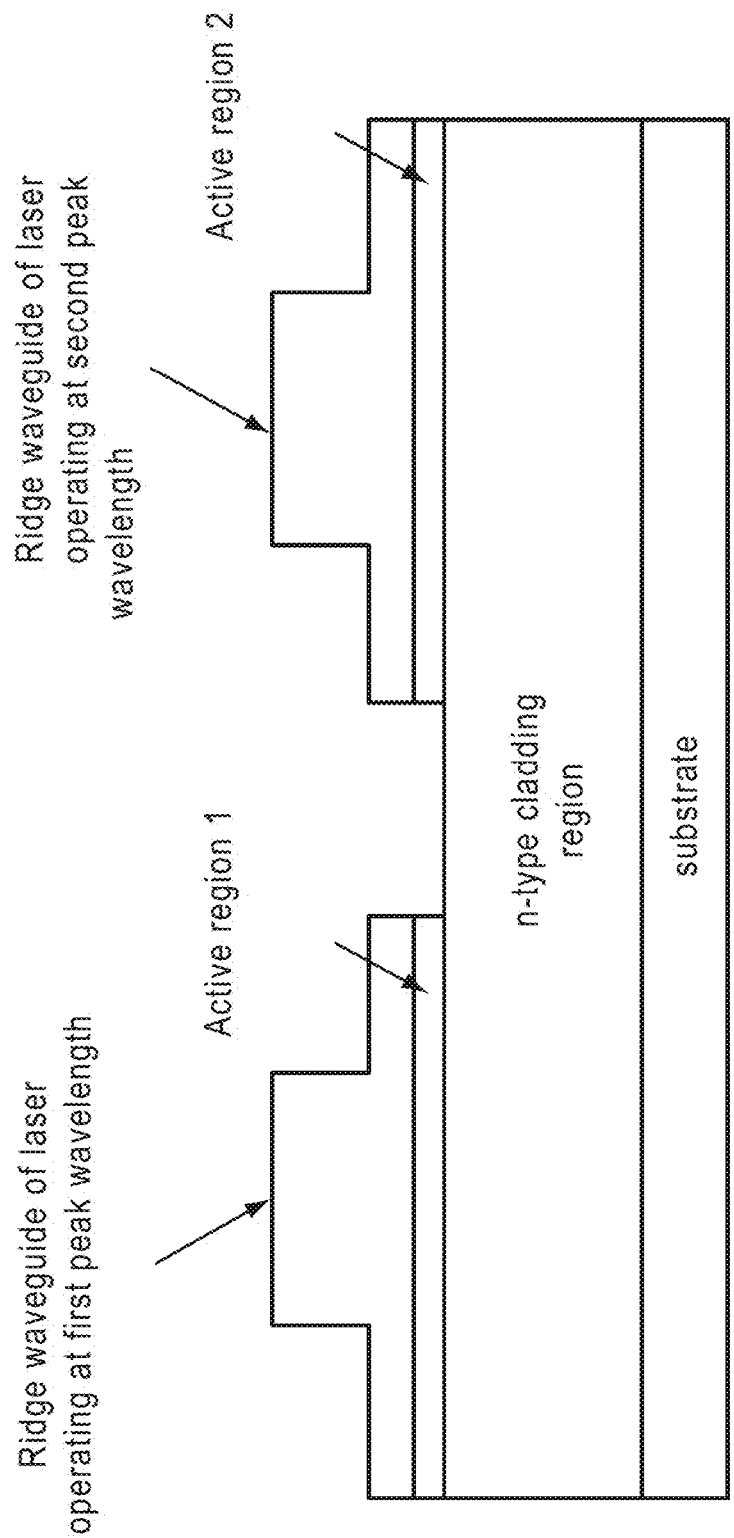
FIG. 2C is a simplified diagram illustrating a laser device with multiple active regions according examples of the present invention.

FIG. 2C is a simplified diagram illustrating a laser device with multiple active regions according examples of the present invention. FIG. 2C shows a substrate, an n-type cladding region overlying the substrate, active region 1 with a first peak wavelength overlying a first portion of the n-type cladding region, and ridge waveguide structures overlying each of the active regions. The ridge waveguide active region 1 operates at a first peak emission wavelength characteristic of active region 1, and the ridge waveguide overlying active region 2 operates at a second peak emission wavelength characteristic of active region 2. This diagram is merely an example, which should not unduly limit the scope of the claims. One of ordinary skill in the art would recognize many variations, alternatives, and modifications. As an example, each active region is used to emit a green laser beam.

According to an example, the following steps are performed in a method for forming a device that includes laser devices having multiple active regions:

1. providing a gallium and nitrogen containing substrate including a first crystalline surface region orientation;
2. defining a first active region by performing a selective etching process;
3. forming a barrier layer within the first active region;
4. growing a first emission layer within the first active region, the first emission layer being characterized by a first wavelength;
5. defining a second active region by performing a selective etching process;
6. growing a second emission layer within the second active area, the second emission layer being characterized by a second wavelength, a difference between the first gain peak wavelength and the second gain peak wave length being at least 10 nm;
7. forming a first cavity member overlaying the first emission layer, the first cavity member being characterized by a length of at least 100 um and a width of at least 0.5 um, the first cavity member being adapted to emit a first laser beam at the first wavelength;
8. forming a second cavity member overlaying the second the emission layer, the second cavity member being characterized by a length of at least 100 um and a width of at least 0.5 um the second cavity member being adapted to emit a second laser beam at the second wavelength; and
9. aligning the first and second cavity members to combine the first and second laser beams at a predetermine region Depending on the application, the above method may also include other steps. For example, the method may include providing an optical member for combining the first and second laser beams. In one example, the method includes shaping a first cleaved surface of the first cavity member, shaping a second cleaved surface of the second cavity member, and aligning the first and second cleaved surfaces to cause the first and second laser beams to combine.

It is to be appreciated that the method described above can be implemented using various types of substrate. As explained above, the substrate member may have a surface region on the polar plane (c-plane), nonpolar plane (m-plane, a-plane), and semipolar plain ({11-22}, {10-1-1}, {20-21}, {30-31}). In the method described above, two active regions and two cavity members are formed. For example, each active region and cavity member pair is associated with a specific wavelength. Depending on the application, additional active regions and cavity members may be formed to obtain desired wavelengths and/or spectral width. In a preferred example, each of the active regions is characterized by a specific spatial dimension associated with a specific wavelength.

In a specific example, a laser apparatus having multiple active regions that provide multiple wavelengths and/or colors is described. The laser apparatus includes a gallium and nitrogen containing substrate including a first crystalline surface region orientation. In a specific example, the substrate comprises Indium bearing material. The apparatus also includes a first active region comprising a barrier layer and a first emission layer, the first emission layer being characterized by a first gain peak wavelength. The apparatus includes a second active region comprising a second emission layer, the second emission layer being characterized by a second gain peak wavelength, a difference between the first gain peak wavelength and the second gain peak wavelength is at least 10 nm.

The apparatus further includes a first cavity member overlaying the first emission layer, the first cavity member being characterized by a length of at least 100 um and a width of at least 0.5 um, the first cavity member being adapted to emit a first laser beam at the first wavelength. The apparatus additionally includes a second cavity member overlaying the second the emission layer, the second cavity member being characterized by a length of at least 100 um and a width of at least 0.5 um the second cavity member being adapted to emit a second laser beam at the second wavelength. The apparatus further includes an output region wherein the first laser beam and the second laser beam are combined.

As explained above, it is often desirable to combine the first and second wavelengths or colors associated thereof for various applications. For example, the apparatus may have optics having dichroic coatings for combining the first and the second laser beam. In one example, the apparatus includes a plurality of polarizing optics for combining the first and the second laser beam. In a specific example, the first cavity member and the second cavity member share a common cleaved facet of mirror edges, which is configured to combine the first and second laser beams.

The first and second laser beams can be associated with a number of color combinations. For example, the first wavelength is associated with a green color and the second wavelength is associated with a blue color.

It is to be appreciated that the laser apparatus can be implemented on various types of substrates. For example, the first crystalline surface region orientation can be a {20-21} plane, and first crystalline surface region orientation can also be a {30-31} plane.

The laser apparatus may also include other structures, such as a surface ridge architecture, a buried hetereostructure architecture, and/or a plurality of metal electrodes for selectively exciting the active region. For example, the active region comprises a first and second gallium and nitrogen containing cladding layers and an indium and gallium containing emitting layer positioned between the first and second cladding layers. The laser apparatus may further includes an n-type gallium and nitrogen containing material and an n-type cladding material overlaying the n-type gallium and nitrogen containing material.

It is to be appreciated examples of the present invention provides method for obtaining multiple laser wavelengths and/or colors after the active regions have already been formed. More specifically, the gain-peak of the semiconductor material can be spatially manipulated post-growth through quantum well intermixing (QWI) processes and/or disordering of the light emitting layers. A QWI process makes use of the metastable nature of the compositional gradient found at heterointerfaces. The natural tendency for materials to interdiffuse is the basis for the intermixing process. Since the lower energy light emitting quantum well layers are surrounded by higher energy barriers of a different material composition, the interdiffusion of the well-barrier constituent atoms will result in higher energy light emitting layers and therefore a blue-shifted (or shorter) gain peak.

The rate at which this process takes place can be enhanced with the introduction of a catalyst. Using a lithographically definable catalyst patterning process, the QWI process can be made selective. This is the process by which virtually all selective QWI is performed, whether it is by the introduction of impurities or by the creation of vacancies. By using these techniques There are a great number of techniques that have evolved over the years to accomplish selective intermixing, such as impurity-induced disordering (IID), impurity-free vacancy-enhanced disordering (IFVD), photoabsorption-induced disordering (PAID), and implantation-enhanced interdiffusion to name just a few. Such methods are capable of shifting the peak gain wavelengths by 1 to over 100 nm. By employing one of these mentioned or any other QWI method to detune the gain peak of adjacent laser devices, the convolved lasing spectrum of the side by side devices can be altered.

In one example, an laser apparatus capable of multiple wavelength is manufactured by using QWI processes described above. The apparatus includes a gallium and nitrogen containing substrate including a first crystalline surface region orientation. The apparatus also includes an active region comprising a barrier layer and a plurality of light emission layers, the plurality of light emission layers including a first emission layer and a second emission layer, the barrier layer being characterized by a first energy level, the first emission layer being characterized by a first wavelength and a second energy level, the second energy level being lower than the first energy level, the first emission layer having a first amount of material diffused from the barrier layer, the second emission layer being characterized by a second wavelength, a difference between the first gain peak wavelength and the second gain peak wave length being at least 10 nm. For example, the second emission layer has a second amount of material diffused from the barrier layer.

The apparatus also includes a first cavity member overlaying the first emission layer, the first cavity member being characterized by a length of at least 100 um and a width of at least 0.5 um, the first cavity member being adapted to emit a first laser beam at the first wavelength. The apparatus includes a second cavity member overlaying the second the emission layer, the second cavity member being characterized by a length of at least 100 um and a width of at least 0.5 um the second cavity member being adapted to emit a second laser beam at the second wavelength. The apparatus includes an output region wherein the first laser beam and the second laser beam are combined.

The laser stripe length, or cavity length ranges from 100 to 3000 μm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

In another example, the gallium and nitrogen containing laser diode fabrication includes an epitaxial release step to lift off the epitaxially grown gallium and nitrogen layers and prepare them for transfer to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semicondonctor-semiconductor, glass-glass, dielectric-dielectric, or a combination thereof.

In yet another preferred variation of this invention, the laser diode member is fabricated based on a process for lifting-off gallium and nitrogen containing epitaxial material and transferring it to the common support member can be used to attach the gallium and nitrogen containing laser epitaxial material to a submount member. In this example, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. The benefits of using this example with lifted-off and transferred gallium and nitrogen containing material are the reduced cost, improved laser performance, and higher degree of flexibility for integration using this technology.

Further process and device description for this example describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

Depending on the application, the active region may include various types of material, such as InP material, GaAs material, and others. the apparatus may have optics having dichroic coatings for combining the first and the second laser beam. In one example, the apparatus includes a plurality of polarizing optics for combining the first and the second laser beam. In a specific example, the first cavity member and the second cavity member share a common cleaved facet of mirror edges, which is configured to combine the first and second laser beams. The first and second laser beams are both green but in slightly different wavelengths.

It is to be appreciated that the laser apparatus can be implemented on various types of substrates. For example, the first crystalline surface region orientation can be a {20-21} plane, and first crystalline surface region orientation can also be a {30-31} plane. The laser apparatus may also include other structures, such as a surface ridge architecture, a buried heterostructure architecture, and/or a plurality of metal electrodes for selectively exciting the active region For example, the active region comprises a first and second gallium and nitrogen containing cladding layers and an indium and gallium containing emitting layer positioned between the first and second cladding layers. The laser apparatus may further includes an n-type gallium and nitrogen containing material and an n-type cladding material overlying the n-type gallium and nitrogen containing material.

In various examples, laser diodes formed on different substrates are packaged together. It is to be appreciated that by sharing packaging of laser diodes, it is possible to produce small device applications (e.g., pico projectors), as multiple laser diodes can tightly fit together. For example, light engines having laser diodes in multiple colors are typical capable of reducing the amount of speckles in display applications. In addition, co-packaged laser diodes are often cost-efficient, as typically fewer optics are needed to combined laser beam outputs from laser diodes as a result of sharing packages.

Figure 3:
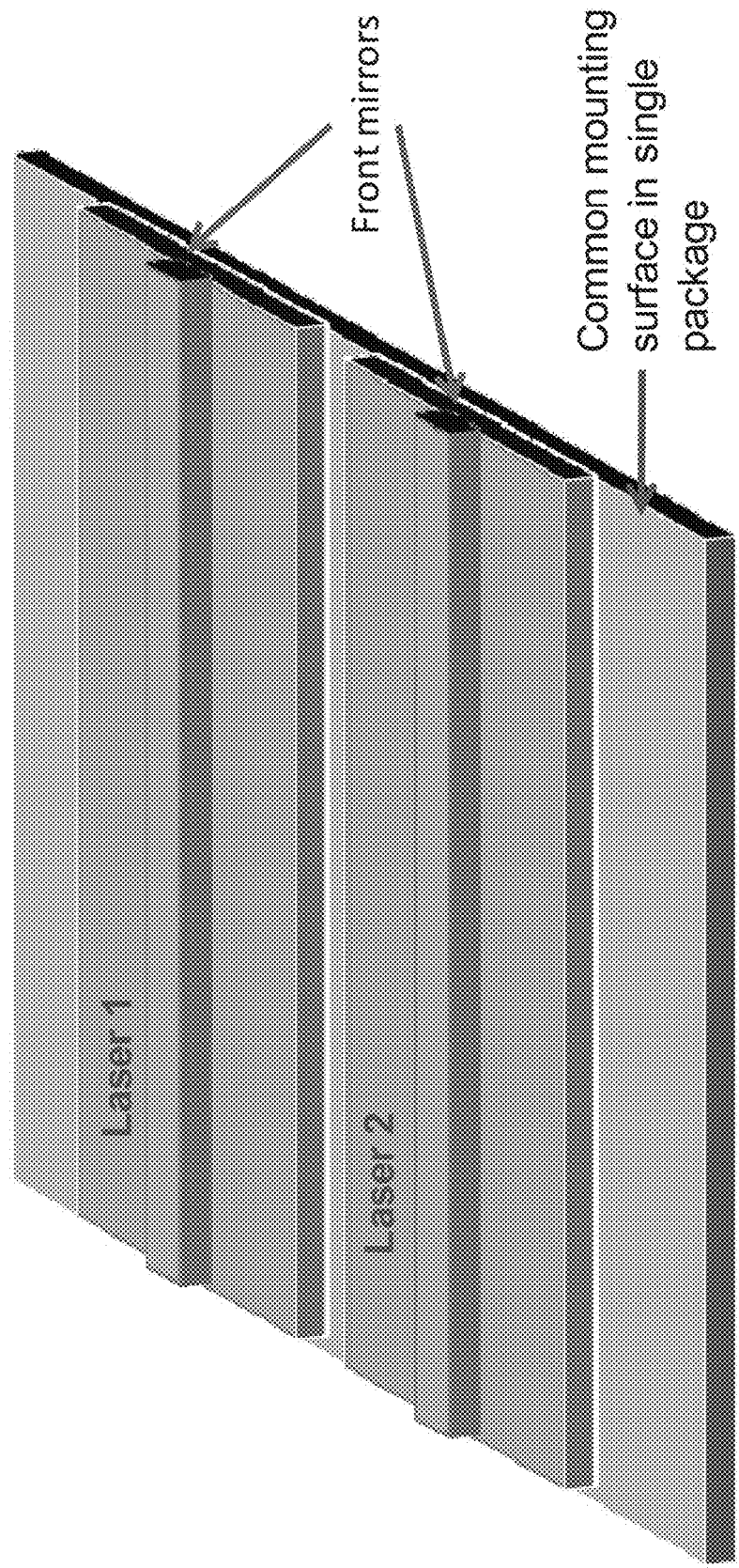
FIG. 3 is a simplified diagram of copackaged laser diodes mounted on common surface within a single package.

FIG. 3 is a simplified diagram of copackaged laser diodes mounted on common surface within a single package. This diagram is merely an example, which should not unduly limit the scope of the claims herein. One of ordinary skill in the art would recognize other variations, modifications, and alternatives. For example, both laser 1 and laser 2 are green laser diodes. By combining the output from both laser diodes, a combined laser beam with high power output can be achieved.

In an example, the present invention provides for a laser device that is configured to pump or illuminate a phosphor or other wavelength conversion material. As background, a direct beam from a laser has a nominal ocular hazard zone (NOHD), which is the distance above which the laser is eye-safe and therefore acceptable to use for a dazzling technique, and below which it is not eye safe (i.e., safe to the eye), and cannot be used for dazzling. In an example, laser techniques can include three zones or operating ranges: (1) non-eye-safe when very close and therefore not allowed to be used, (2) medium range dazzling zone where it is eye safe but producing the dazzling effect, and (3) then the longer range which is eye safe and not dazzling. In an example, the higher the power laser, the longer the NOHD. Of course, there can be variations, modifications, and alternatives.

In an example, the present technique using the laser pumped phosphor is incoherent irradiation so the NOHD should be near zero, and still has excellent spatial brightness and dazzling for a long area. Further details of the present laser pumped phosphor can be found throughout the present specification and more particularly below.

In another example, a direct laser beam has a narrow spectrum and can be blocked with narrow filters on glasses, while still allowing the illuminated party to see all of the other colors. In an example, the laser pumped phosphor has broad white emission so the only way to block is to wear black glasses, which would render the illuminated party unable to see. In an example, laser pumped phosphor techniques produce light that enables longest range and highest resolution viewing from the sender's or user's eye. In an example, a direct laser beam has a narrow spectrum. The laser beam is a single color and is not optimal to help the human eye see images at longest possible range with highest possible resolution. In an example, the laser pumped phosphor illumination offers color temp and CRI for longest range and highest resolution viewing from the sender's eye. This enables a dual functional device: spotlight illumination to enhance viewing, and then increased power for dazzling effect.

In an example, the present laser pumped phosphor is compatible with the other techniques in our patent, i.e. Strobing with temporal pulsing. In an example, the laser pumped phosphor is all solid state and solves the challenges of lamps such as compactness, lifetime, fragility, resistance to shock vibe, temp cycling, on off cycling, mercury, among others. Further details of a technique for a laser pumped phosphor can be found throughout the present specification and more particularly below.

In one example, the present invention provides a laser pumped phosphor dazzling apparatus. The laser pumped phosphor dazzling apparatus includes a housing member. The laser pumped phosphor dazzling device includes a laser device. The laser device comprises at least a gallium and nitrogen containing device having an active region and a cavity member. The laser device is configured to emit a laser beam having a wavelength about 390 nm to about 480 nm. The active regions include a gallium and nitrogen containing material, the laser beam being characterized by a first direction. The laser dazzling device includes a driving circuit electrically coupled to the laser device. The driving circuit is adapted to deliver electrical energy to the laser device. The electrical energy is less than 800 mW, but can be others such as greater than 1 W, greater than 5 W, or greater than 10 W. The laser dazzling device includes a power source electrically coupled to the driving circuit. The laser dazzling device includes an activation module electrically coupled to the driving circuit. The activation module is configured to send an activation signal to the driving circuit, which electrifies the laser diode and generates an output laser beam. The output laser beam is optically coupled to one or more phosphor members. In some examples, the laser beam is shaped or collimated with optics prior to incidence on the phosphor. In some examples, turning mirrors or dichroic mirrors are configured to direct the laser beam and phosphor emission. The laser beam is configured to excite the one or more phosphor member wherein the phosphor member absorbs at least some of the radiation in the laser beam and converts it to a second wavelength such as green in the 500 to 550 nm range. The phosphor emission is typically coupled into optical members for beam collimation and/or beam shaping and is then directed out of the dazzling device to the environment and configured for dazzling. The laser dazzling device includes a sight for aligning the laser beam to a desired position. In other examples more than one laser diode can be used and phosphor members with different colors can be used. In some examples, multiple phosphors can be used for a multi-color a variable color emission. In one preferred example, the dazzling device can be configured to dynamically change the laser beam and phosphor member coupling characteristic such that the user can select different dazzling device output colors. In one example, the dazzling device is configured to emit a green dazzling emission and a white dazzling or spot lighting emission in which the user can select.

According to another example, the present invention provides a laser pumped phosphor dazzling device. The laser pumped phosphor dazzling device includes at least one laser device and at least one phosphor member. The laser device comprises a first wavelength selected from a violet wavelength in the 390 nm to 425 nm range or a blue wavelength in the 425 nm to 480 nm range. The laser diode comprises an active region and a cavity member. The laser diode is configured to emit a laser beam at an intensity level of less than 800 mW, but can be others such as greater than 1 W, greater than 5 W, or greater than 10 W. The active region includes a gallium and nitrogen containing material. The laser beam is characterized by a first direction. The laser pumped phosphor dazzling device includes a driving circuit electrically coupled to the laser device. The driving circuit is adapted to deliver electrical energy to the laser device. The electrical energy is less than 800 mW, but can be others such as greater than 1 W, greater than 5 W, or greater than 10 W. The laser dazzling device includes a power source electrically coupled to the driving circuit. The laser pumped phosphor dazzling device includes an activation module electrically coupled to the driving circuit. The activation module is configured to send an activation signal to the driving circuit, the activation module comprising an electrical trigger. When the trigger is activated, laser diode is electrified and generates an output laser beam. The output laser beam is optically coupled to one or more phosphor members. In some examples, the laser beam is shaped or collimated with optics prior to incidence on the phosphor. In some examples, turning mirrors or dichroic mirrors are configured to direct the laser beam and phosphor emission. The laser beam is configured to excite the one or more phosphor member wherein the phosphor member absorbs at least some of the radiation in the laser beam and converts it to a second wavelength such as green in the 500 to 550 nm range. The phosphor emission is typically coupled into optical members for beam collimation and/or beam shaping and is then directed out of the dazzling device to the environment and configured for dazzling. The laser dazzling device includes a sight for aligning the laser beam to a desired position.

In an alternative specific example, the present invention provides a laser pumped phosphor dazzler apparatus. The laser dazzler apparatus includes a laser device including a laser diode a phosphor member. In other examples more than one laser diode can be used and phosphor members with different colors can be used. In some examples, multiple phosphors can be used for a multi-color a variable color emission. In one preferred example, the dazzling device can be configured to dynamically change the laser beam and phosphor member coupling characteristic such that the user can select different dazzling device output colors. In one example, the dazzling device is configured to emit a green dazzling emission and a white dazzling or spot lighting emission in which the user can select. The one or more phosphor members configured in the laser pumped phosphor dazzling device can be operable in a static configuration or a dynamic configuration. Dynamic configurations can offer the advantage of cooling the phosphor and spreading the optical intensity of the laser beam over a larger time averaged area, but are also less rugged and more complicated with the required moving parts. An example of a dynamic phosphor would be a phosphor mounted on a spinning wheel. In a preferable example, the one or more phosphor members are operable in a static mode such that when they are being excited with the laser beam they are not substantially moving. The static phosphor is preferable since it offers a more rugged and simplistic mechanical design.

Phosphor selection is a key consideration within the laser pumped phosphor dazzling device. In the static configuration the phosphor may need to be able to withstand the extreme optical intensity and associated heating induced by the laser excitation spot without substantial degradation. Important characteristics to consider for phosphor selection include;

A high conversion efficiency of the optical excitation power to the emitted phosphor emission such as green. In the example of a blue laser diode exciting a yellow or a green phosphor, a conversion efficiency of over 50 lumens per optical watt, or over 100 lumens per optical watt, or over 200 lumens per optical watt, or over 300 lumens per optical watt is desired.

A high optical damage threshold capable of withstanding from about 0.1 W to about 10 W of laser power in a spot comprising a diameter of about 2 mm, 1 mm, 500 um, 200 um, 100 um, or even 50 um.

High thermal damage threshold capable of withstanding temperatures of over 100° C., 150° C., over 200° C., or over 300° C. without decomposition or unacceptable degradation.

A low thermal quenching characteristic such that the phosphor remains efficient as it reaches temperatures of over 150° C., 200° C., or 250° C.

A high thermal conductivity to dissipate the heat and regulate the temperature. Thermal conductivities of greater than 1 W/mK, greater than 3 W/mK, greater than 5 W/mK, greater than 10 W/mKm, and even greater than 15 W/mK are desirable.

A proper phosphor emission color for the application

A suitable porosity characteristic that leads to the desired scattering of the coherent excitation without unacceptable reduction in thermal conductivity or optical efficiency.

A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.

A surface condition optimized for the application. In an example, one or more of the phosphor surfaces can be intentionally roughened for improved light extraction.

In a preferred example, a violet laser operating in the 390 nm to 420 nm or blue laser diode operating in the 420 nm to 480 nm wavelength range would be optically coupled with a phosphor material providing a greenish emission in the 500 nm to 560 nm range such that a green emission is generated from the laser dazzling device.

In an alternative example that may be in combination with green phosphor example described above, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other examples phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred example the phosphor material is comprised of a YAG material doped with Ce with a conversion efficiency of greater than 50 lumens per optical watt, of greater than 100 lumens per optical watt, greater than 200 lumens per optical watt, or greater than 300 lumens per optical watt, and can be a polycrystalline ceramic material or a single crystal material.

In some examples of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. In a reflective mode operation, a reflector can be added to the backside of a ceramic phosphor, reducing loss. The phosphor can be shaped to increase in-coupling, increase outcoupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some examples, certain types of phosphors will be best suited in this demanding application with a laser excitation source. As an example, a ceramic yttrium aluminum garnets (YAG) doped with Ce3+ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The YAG:CE can be configured to emit a yellow or a green emission. In some examples the YAG can be doped with Eu to emit a red emission.

In a preferred example according to this invention, the laser pumped phosphor dazzling device is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt. Additionally, the ceramic YAG:Ce phosphors is characterized by a temperature quenching characteristics above 100° C., above 150° C., above 200° C., or above 250° C. and a high thermal conductivity of 5-10 W/mK to effectively dissipate heat to a heat sink member and keep the phosphor at an operable temperature.

In another preferred example according to this invention, the laser pumped phosphor dazzling device is configured with a single crystal phosphor (SCP) such as YAG:Ce. In one example the Ce:$Y_3Al_5O_{12}$ SCP can be grown by the Czochralski technique. In this example according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt. Additionally, the single crystal YAG: Ce phosphors is characterized by a temperature quenching characteristics above 150° C., above 200° C., or above 300° C. and a high thermal conductivity of 8-20 W/mK to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some examples the YAG:CE can be configured to emit a yellow emission. In alternative or the same examples a YAG:CE can be configured to emit a green emission. In yet alternative or the same examples the YAG can be doped with Eu to emit a red emission. In alternative embodiments, silicon nitrides or aluminum-oxi-nitrides can be used as the crystal host materials for red, green, yellow, or blue emissions.

In one example of the present invention the phosphor material contains a yttrium aluminum garnet host material and a rare earth doping element, and others. In an example, the wavelength conversion element is a phosphor which contains a rare earth doping element, selected from one or more of Ce, Nd, Er, Yb, Ho, Tm, Dy and Sm, combinations thereof, and the like. In an example, the phosphor material is a high-density phosphor element. In an example, the high-density phosphor element has a density greater than 90% of pure host crystal. Cerium (III)-doped YAG (YAG: Ce3+, or Y3Al5O12:Ce3+) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (blueish) white. The yellow emission of the Ce3+:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with Ce3+ ions (Y1-aGda)3(Al1-bGab)5O12:Ce3+, SrGa2S4:Eu2+, SrS:Eu2+, terbium aluminum based garnets (TAGs) (Tb3Al5O5), colloidal quantum dot thin films containing CdTe, ZnS, ZnSe, ZnTe, CdSe, or CdTe.

In further alternative examples, some rare-earth doped Sialons can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red CaAlSiN3-based (CASN) phosphor may be used.

In yet a further example, sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from one or more of $(Y, Gd, Tb, Sc, Lu, La)_3(Al, Ga, In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from one or more of the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}, Mn^{2+}$; $(Y,Lu)_2WO_6:Eu^{3+}, Mo^{6+}$; $(Ba,Sr,Ca)_3Mg_xSi_2O_8:Eu^{2+}, Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and Eu$^{3+}$ activated phosphate or borate phosphors; and mixtures thereof. Further details of other phosphor species and related techniques can be found in U.S. Pat. No. 8,956,894, in the names of Raring, et al. issued Feb. 17, 2015, and titled White light devices using non-polar or semipolar gallium containing materials and phosphors, which is commonly owned, and hereby incorporated by reference herein.

In some examples of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the laser pumped phosphor dazzling device based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons.

For optimal phosphor performance and lifetime, not only should the phosphor material itself have a high thermal conductivity, but it should also be attached to a submount or support member with a high thermal conductivity joint to transmit the heat away from the phosphor and to a heat-sink. Candidate materials for support members or submount members are SiC, AlN, BeO, diamond, copper, copper tungsten, sapphire, aluminum, steel, or others. The interface joining the phosphor to the submount member or common support member must be carefully considered. The joining material or attachment interface of the phosphor to the support member should be comprised of a high thermal conductivity material such as solder [or other] and be substantially free from voids or other defects that can impede heat flow. Moreover, in a reflective mode phosphor configuration, the attachment interface may be designed for an increased reflectivity to maximize the useful white light exiting the emission surface of the phosphor. Examples joining materials include AuSn solders, SAC solders, lead containing solders, indium solders, indium, and other solders. The joint could also be formed from thermally conductive glues, thermal epoxies, and other materials. In some examples, glue materials can be used to fasten the phosphor. Ideally the phosphor bond interface will have a substantially large area with a flat surface on both the phosphor side and the support member sides of the interface.

In the present invention, the laser diode output beam must be configured to be incident on the phosphor material to excite the phosphor. In some examples the laser beam may be directly incident on the phosphor and in other examples the laser beam may interact with an optic, reflector, dichroic mirror, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material.

In a dazzling or spotlighting application the light exiting the apparatus must be directed or projected to a specified location or area. In some examples of this laser pumped phosphor dazzling invention, the emission from the phosphor member in the laser pumped phosphor dazzling device is combined with one or more optical members to manipulate the generated light prior to exiting the device. As an example, to direct the light it should be collimated such that the photons comprising the emission are propagating parallel to each other along the desired axis of propagation. The degree of collimation depends on the light source and the optics using to collimate the light source. For the highest collimation a perfect point source of light with 4 pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one example a reflector of the present invention is coupled to the phosphor emission. Specifically, a parabolic (or paraboloid or paraboloidal) reflector is deployed to project the emission. By positioning the phosphor at or near the focal point of a parabolic reflector, the plane waves will be reflected and propagate as a collimated beam along the axis of the parabolic reflector.

In another example a simple singular lens or system of lenses is used to collimate the phosphor emission into a projected beam. In a specific example, a single aspheric lens is place in front of the phosphor member and configured to collimate the emitted light. In an example the lens is comprised of a transparent material such as a glass, SiC, sapphire, quartz, a ceramic, a composite, or a semiconductor.

Figure 4:
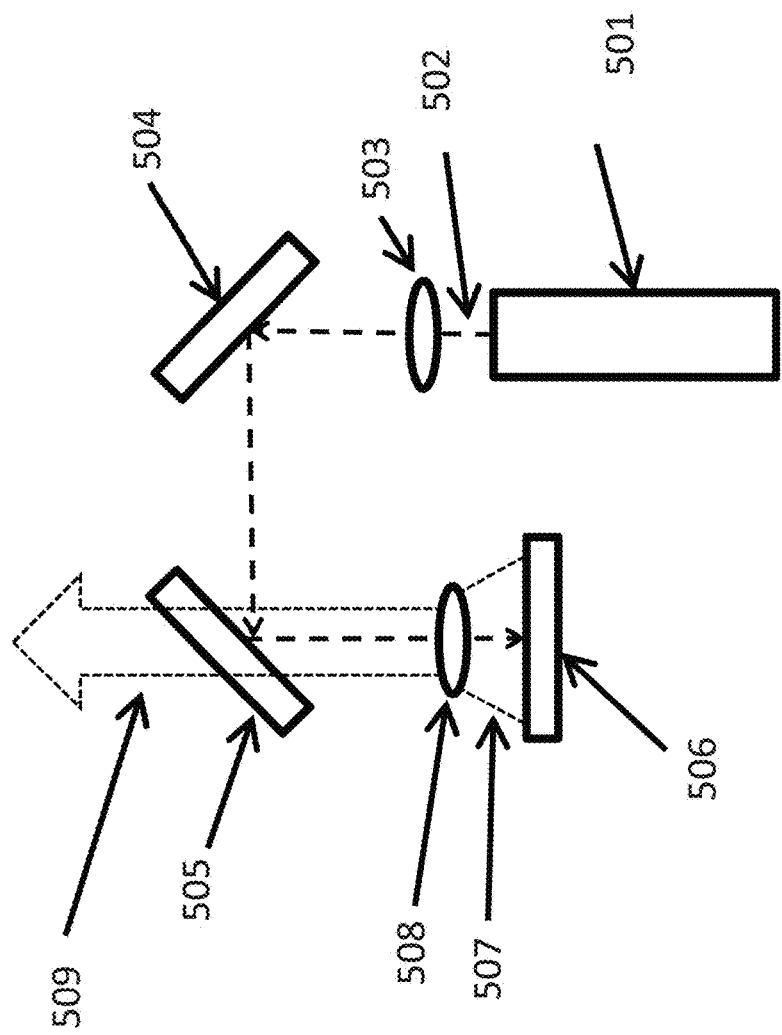
FIG. 4 is a simplified diagram of a laser pumped phosphor configuration according to an example of the present invention.

FIG. 4 is a simplified diagram of a laser pumped phosphor dazzler configuration according to an example of the present invention wherein the phosphor is operated in a reflective mode. As shown is the laser pumped phosphor configuration, including system and method. In an example, the system can be a laser dazzling apparatus, among other applications. In an example, the system has a housing member. The system has a laser device 501. In an example, the laser device includes an active region and a cavity member. In an example, the laser device is configured to emit a laser beam 502 having a first wavelength about 390 nm to 480 nm. In an example, the active regions includes a gallium and nitrogen containing material. In an example, the laser beam is characterized by a first direction, as shown in 502.

In an example, the system has a driving circuit electrically coupled to the laser device, the driving circuit being adapted to deliver electrical energy to the laser device. The system also has a power source electrically coupled to the driving circuit, and an activation module electrically coupled to the driving circuit, the activation module being configured to send an activation signal to the driving circuit.

As shown, the system optionally has an optic 503 configured to collimate and/or shape the laser beam. This is an optional member, but could be a collimating lens such as a fast axis collimator, slow axis collimator, a spheric lens, or an aspheric lens. The system has an incident mirror 504 operably coupled to reflect the laser beam from the laser device from a first direction to a second direction. The incident mirror can be a turning mirror, a dichroic mirror, a fixed mirror, a dynamic mirror, among others.

In an example, the system has a dichroic mirror 505 operably coupled to the incident mirror to reflect the laser beam from the incident beam toward a phosphor plate 506. In an example the phosphor emits a lambertian emission 507. A lens 508 is configured to collimate and/or shape the phosphor emission and any residual light from the laser beam from the dichroic mirror to the phosphor plate. The lens can be an aspherical lens, a spherical lens, or a different lens. In an alternative example a reflector such as a parabolic reflector can be used to collimated the emission.

In an example, a wavelength conversion material configured to convert a portion of or all of the electromagnetic radiation from the laser beam from the first wavelength to a second wavelength. Examples of such materials can include ceramic or single crystal YAG based phosphors doped with a Ce species to form a green emission or a yellow emission, but can be others as described in this invention.

In an example, a beam path derived from a beam having the second wavelength configured to be collimated by the lens and traversed through the dichroic mirror 505 to create an output from the dazzling device 509. Of course, there can be other variations, modifications, and alternatives.

Figure 5:
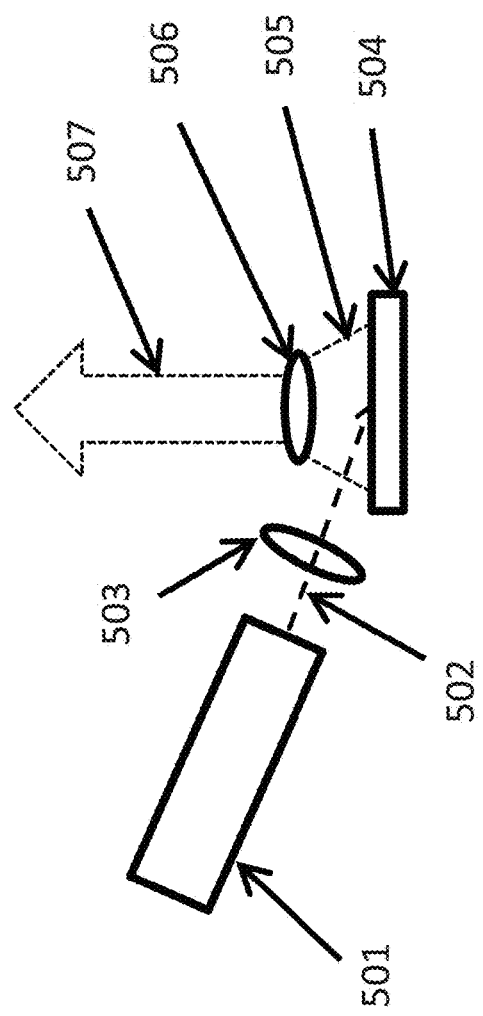
FIG. 5 is a simplified diagram of a simplified version of a reflective mode laser pumped phosphor dazzler configuration according to an example of the present invention.

FIG. 5 is a simplified diagram of a simplified version of a reflective mode laser pumped phosphor dazzler configuration according to an example of the present invention. As shown is the laser pumped phosphor configuration, including system and method. In an example, the system can be a laser dazzling apparatus, among other applications. In an example, the system has a housing member. The system has a laser device 501. In an example, the laser device includes an active region and a cavity member. In an example, the laser device is configured to emit a laser beam 502 that is off-axis from a normal incidence to the phosphor plate. The laser beam has first wavelength about 390 nm to 480 nm. In an example, the active region includes a gallium and nitrogen containing material. In an example, the laser beam is characterized by a first direction, as shown in 502.

In an example, the system has a driving circuit electrically coupled to the laser device, the driving circuit being adapted to deliver electrical energy to the laser device. The system also has a power source electrically coupled to the driving circuit, and an activation module electrically coupled to the driving circuit, the activation module being configured to send an activation signal to the driving circuit.

As shown, the system optionally has an optic 503 configured to collimate and/or shape the laser beam. This is an optional member, but could be a collimating lens such as a fast axis collimator, slow axis collimator, a spheric lens, or an aspheric lens. The laser beam is directed to the phosphor member 504 at a non-orthogonal incidence angle. In an example the phosphor emits a lambertian emission 505. A lens 506 is configured to collimate and/or shape the phosphor emission and any residual light from the laser beam. The lens can be an aspherical lens, a spherical lens, or a different lens. In an alternative example a reflector such as a parabolic reflector can be used to collimate the emission. In an example, the collimated beam 507 is output from the dazzling device. Of course, there can be other variations, modifications, and alternatives.

Figure 6:
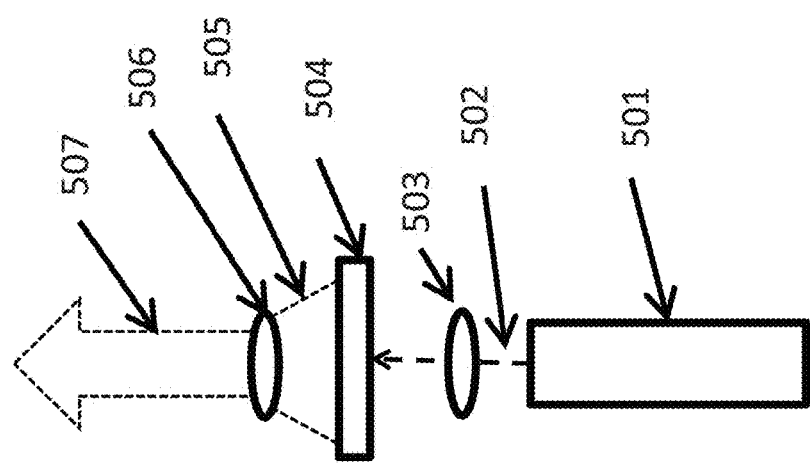
FIG. 6 is a simplified diagram of a laser pumped phosphor dazzler configuration according to an example of the present invention wherein the phosphor is operated in a transmissive mode.

FIG. 6 is a simplified diagram of a laser pumped phosphor dazzler configuration according to an example of the present invention wherein the phosphor is operated in a transmissive mode. As shown is the laser pumped phosphor configuration, including system and method. In an example, the system can be a laser dazzling apparatus, among other applications. In an example, the system has a housing member. The system has a laser device 501. In an example, the laser device includes an active region and a cavity member. In an example, the laser device is configured to emit a laser beam 502 having a first wavelength about 390 nm to 480 nm. In an example, the active region includes a gallium and nitrogen containing material. In an example, the laser beam is characterized by a first direction, as shown in 502.

In an example, the system has a driving circuit electrically coupled to the laser device, the driving circuit being adapted to deliver electrical energy to the laser device. The system also has a power source electrically coupled to the driving circuit, and an activation module electrically coupled to the driving circuit, the activation module being configured to send an activation signal to the driving circuit.

As shown, the system optionally has an optic 503 configured to collimate and/or shape the laser beam. This is an optional member, but could be a collimating lens such as a fast axis collimator, slow axis collimator, a spheric lens, or an aspheric lens. The laser beam is directed to the back surface of a phosphor member 504. In an example the phosphor emits a lambertian emission 505. A lens 506 is configured to collimate and/or shape the phosphor emission and any residual light from the laser beam from the dichroic mirror to the phosphor plate. The lens can be an aspherical lens, a spherical lens, or a different lens. In an alternative example a reflector such as a parabolic reflector can be used to collimated the emission. In an example, the collimated beam 507 is output from the dazzling device. Of course, there can be other variations, modifications, and alternatives.

In one example the laser pumped phosphor dazzling device is configured to be operable with different modes of operation wherein some of the modes of operation require a different output color. For example, a first mode of operation of the dazzling device could be a dazzling mode wherein a green light is output from the device in a constant output or strobed output. The first mode of operation could be configured with a violet or blue laser diode exciting a green phosphor to generate a green emission. In this example, the user can change the mode of operation to a second mode, a third mode, or a higher mode of operation by actuating a switch, dial, or other mechanism to alter the laser diode beam coupling to phosphor characteristic. A second mode of operation could include a white light generation. The white light generation could be accomplished with a blue laser diode exciting a yellow phosphor, wherein the blue light in combination with the yellow emission could comprise a white light. The white light could be operable in a constant light generation configuration for spotlighting or could be operable in a strobed or pulsed generation configuration for a dazzling effect. A third mode of operation could utilize the generation of a red light where in the blue or violet laser diode excites a red phosphor. Of course these are merely examples of a multi-mode dazzling device based on laser pumped phosphors.

Figure 7:
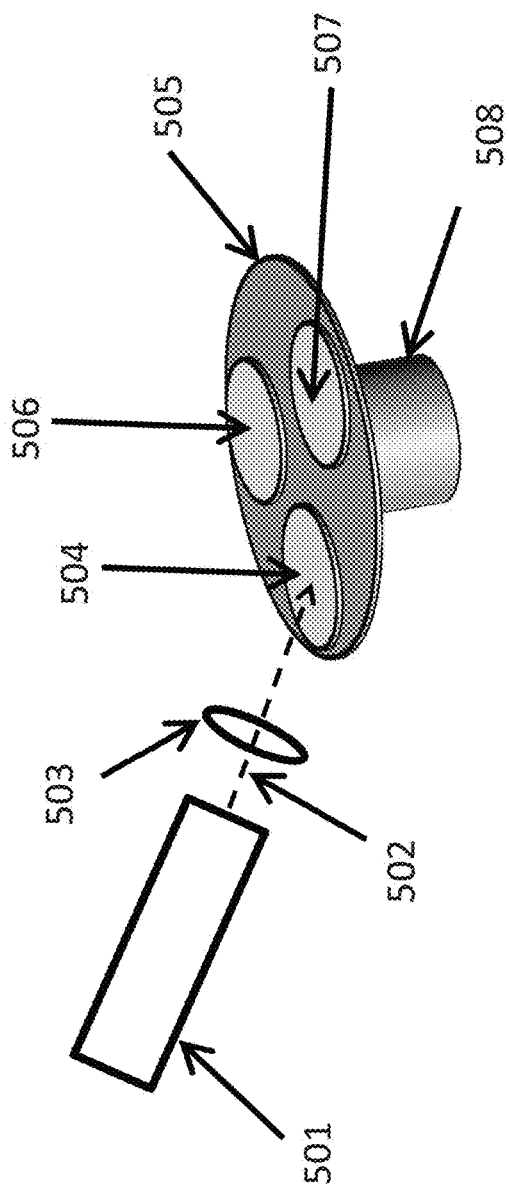
FIG. 7 is a simplified diagram of a laser pumped phosphor dazzler configuration according to an example of the present invention wherein multiple phosphor members are operated in a reflective mode and are configured to move in and out of the laser diode beam pathway to select the phosphor of interaction.

In one example configuration of a multi-mode laser pumped phosphor dazzling device, the multiple phosphor members are included and are configured to translate their position for a selective coupling of the laser beam based on the user's selection. FIG. 7 is a simplified diagram of a laser pumped phosphor dazzler configuration according to an example of the present invention wherein multiple phosphor members are operated in a reflective mode and are configured to move in and out of the laser diode beam pathway to select the phosphor of interaction. As shown is the laser pumped phosphor configuration, including system and method. In an example, the system can be a laser dazzling apparatus, among other applications. In an example, the system has a housing member. The system has a laser device 501. In an example, the laser device includes an active region and a cavity member. In an example, the laser device is configured to emit a laser beam 502 having a first wavelength about 390 nm to 480 nm. In an example, the active region includes a gallium and nitrogen containing material. In an example, the laser beam is characterized by a first direction, as shown in 502.

As shown, the system optionally has an optic 503 configured to collimate and/or shape the laser beam. This is an optional member, but could be a collimating lens such as a fast axis collimator, slow axis collimator, a spheric lens, or an aspheric lens. The laser beam is directed to a first phosphor member 504 at a non-orthogonal incidence angle. In some examples, the first phosphor member may be green emitting phosphor member to generate a green light. In this example, the multiple phosphor members are mounted on a support member 505. The support member also supports one or more additional phosphors. In this a second phosphor 506 is mounted on the support member and third phosphor member 507 is mounted on the support member. The second phosphor member could be a yellow phosphor to generate a yellow emission that when mixed with the blue laser diode emission a white light is formed. The third phosphor member can be comprised of a red phosphor such that when the laser diode beam excites the phosphor member it emits a red light. In other examples the second or third phosphor member could be replaced with a mirror or reflector member to reflect the laser beam and generate a collimated laser diode output beam. The support member 505 is attached to a mechanical member 508 configured to translate the position of the support member and hence translate the phosphor members and configure the laser diode beam to selectively couple to the phosphor members or reflector members. In this example, the support member is a circular member and the mechanical member is configured to rotate such that the phosphors rotate and interact with the fixed position of the laser diode beam. In other examples, the mechanical member may translate its position laterally, horizontally, or vertically to modify the interaction of the laser beam with the phosphor members.

A lens or system of lenses can be configured to collimate and/or shape the emission from one or more of the phosphor members along with any residual light from the laser beam. The lens can be an aspherical lens, a spherical lens, or a different lens. In an alternative example a reflector such as a parabolic reflector can be used to collimate the emission. Of course, there can be other variations, modifications, and alternatives.

In an alternative example of a multi-color laser pumped phosphor dazzler device the phosphor members are maintained in a fixed location and the beam is spatially manipulated to selectively interact with the desired phosphor members. In an example, the laser beam could be incident on a mirror that functions to direct the beam to the phosphor member. In one example the mirror can be manipulated to change the direction of the reflected beam by changing the reflection angle to intentionally guide the beam to interact with the desired phosphor member to generate the desired emission beam. The reflection angle from the mirror can be selected from several methods including a mechanical method wherein the user must mechanical rotate or move an actuator that translates to the mirror movement or an electromechanical method wherein the mirror reflection angle is modified with electrical signals. In some examples, microelectromechanical mirrors (MEMS) are used as the mirror devices and can be dynamically adjusted for a given phosphor interaction or beam output.

In some examples of the laser pumped phosphor dazzling device according to the present invention safety features and design considerations can be included. In any based laser based source, safety is a key aspect. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor.

In one example, an optical beam dump serves as an optical element to absorb the laser beam that could otherwise be dangerous to the outside environment. Design concerns in the beam dump would include the management and reduction of laser beam back reflections and scattering as well as dissipation of heat generated by absorption. Simple solutions where the optical power is not too high, the absorbing material can be as simple as a piece of black velvet or flock paper attached to a backing material with a glue, solder, or other material. In high power applications such as those that would incorporated into high power laser systems, beam dumps must often incorporate more elaborate features to avoid back-reflection, overheating, or excessive noise. Dumping the laser beam with a simple flat surface could result in unacceptably large amounts of light escaping to the outside world where it could be dangerous to the environment even though the direct reflection is mitigated. One approach to minimize scattering is to use a porous or deep dark cavity material deep lined with an absorbing material to dump the beam.

A commonly available type of beam dump suitable for most medium-power lasers is a cone of aluminum with greater diameter than the beam, anodized to a black color and enclosed in a canister with a black, ribbed interior. Only the point of the cone is exposed to the beam head-on; mostly, incoming light grazes the cone at an angle, which eases performance requirements. Any reflections from this black surface are then absorbed by the canister. The fins both help to make light less likely to escape, and improve heat transfer to the surrounding air.

In some examples of this invention, safety features and systems use active components. Example active components include photodetectors/photodiode and thermistors. A photodiode is a semiconductor device that converts light into current wherein a current is generated when light within a certain wavelength range is incident on the photodiode. A small amount of current is also produced when no light is present. Photodiodes may contain optical filters, built-in lenses, and may have large or small surface areas. Strategically located detectors designed to detect direct blue emission from the laser, scattered blue emission, or phosphor emission such as green phosphor emission can be used to detect failures of the phosphor where a violet or blue beam could be exposed or other malfunctions of the light source. Upon detection of such an event, a close circuit or feedback loop would be configured to cease power supply to the laser diode and effectively turn it off. As an example, a detector used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system. In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off.

In an example, the present invention provides a vehicle comprising a laser apparatus. The apparatus has a housing configured to the vehicle, a laser device configured to the housing where the laser device including a blue laser diode. In an example, the blue laser diode comprises an active region and a cavity member. In an example, the active region includes a gallium and nitrogen containing material, the laser beam being characterized by a first direction. The apparatus has a driving circuit electrically coupled to the laser device, the driving circuit being adapted to deliver electrical energy to the laser device, a power source electrically coupled to the driving circuit, and an activation module electrically coupled to the driving circuit. In an example, the activation module is configured to send an activation signal to the driving circuit. In an example, the activation module comprises an electrical switch. The apparatus has an incident mirror operably coupled to reflect the laser beam from the laser device and a wavelength conversion material configured to convert a portion of or all of the electromagnetic radiation from the laser beam from the first wavelength to a second wavelength. In an example, a resulting mixture of wavelengths is from at least the second from the wavelength conversion material comprising a white emission. The apparatus has a white emission beam path comprising a collimation member such as a lens or parabolic reflector to produce a collimated white beam.

In an example, the invention provides a laser source apparatus. The apparatus has a housing member and a laser device. In an example, the laser device includes an active region and a cavity member. In an example, the laser device is configured to emit a laser beam having a first wavelength about 390 nm to 480 nm. In an example, the active regions includes a gallium and nitrogen containing material. In an example, the laser beam is characterized by a first direction. The apparatus has a driving circuit electrically coupled to the laser device, the driving circuit being adapted to deliver electrical energy to the laser device and generate a laser beam and a power source electrically coupled to the driving circuit. The apparatus has a phosphor member positioned in the optical pathway of the laser diode beam and configured for excitation from the laser beam. In an example, the phosphor member is operable in a reflective mode and is configured to convert at least a portion of the electromagnetic radiation from the laser beam from the first wavelength to a second wavelength. In an example, the apparatus has an optical member configured to collimate and/or project a beam comprising at least the second wavelength. In an example, the collimated output beam at the second wavelength configured for dazzling or illumination.

In an example, the invention provides a laser source apparatus. The apparatus has a housing member and a laser device, which has an active region and a cavity member. In an example, the laser device is configured to emit a laser beam having a first wavelength about 390 nm to 480 nm. In an example, the active regions include a gallium and nitrogen containing material. In an example, the laser beam is characterized by a first direction. In an example, the apparatus has a driving circuit electrically coupled to the laser device. In an example, the driving circuit is adapted to deliver electrical energy to the laser device and generate a laser beam. In an example, the apparatus has a power source electrically coupled to the driving circuit and a phosphor member positioned in an optical pathway of the laser diode beam and configured for excitation from the laser beam. In an example, the phosphor member is operable in a reflective mode and configured to convert at least a portion of the electromagnetic radiation from the laser beam from the first wavelength to a second wavelength. In an example, the apparatus has an optical member configured to collimate and/or project a beam comprising at least the second wavelength. In an example, the collimated output beam at the second wavelength is configured for dazzling or illumination.

In an example, the invention provides a laser source apparatus. The apparatus has a housing member and a laser device, which has an active region and a cavity member. In an examples, the laser device being configured to emit a laser beam having a first wavelength about 390 nm to 480 nm, the active regions including a gallium and nitrogen containing material, the laser beam being characterized by a first direction. In an example, the apparatus has a driving circuit electrically coupled to the laser device. In an example, the driving circuit is adapted to deliver electrical energy to the laser device and generate a laser beam. In an example, the apparatus has a power source electrically coupled to the driving circuit. The apparatus has a first phosphor member or a second phosphor member. In an example, the laser beam is configured for selective optical coupling and excitation to at least the first phosphor member or the second phosphor member. In an example, at least the first phosphor member configured to convert at least a portion of the electromagnetic radiation from the laser beam to a second wavelength and the second phosphor member configured to convert at least a portion of the electromagnetic radiation from the laser beam to a third wavelength. In an example, the apparatus has a pathway configured from the laser device. In an example, a selectivity of the optical coupling from the laser diode beam to at least the first phosphor member or the second phosphor member configured by selecting the phosphor member in the pathway of the laser beam. In an example, the apparatus has a switch device configured to select the phosphor member in the optical pathway by changing a spatial position of the laser beam to be directed to either the first phosphor member or the second phosphor member or by changing the spatial position of the laser beam to be directed to either the first phosphor member or second phosphor member. In an example, an optical member is configured to collimate and/or project an output beam comprising at least the second wavelength or the third wavelength.

In an example, the first phosphor member is operable in a reflective mode and configured to convert at least a portion of the electromagnetic radiation from the laser beam from the first wavelength to a second green wavelength in the 500 nm to 550 nm range. In an example, the second phosphor member is operable in a reflective mode and configured to convert at least a portion of the electromagnetic radiation from the laser beam from a first blue wavelength in the 420 nm to 480 nm range to a second yellow wavelength in the 550 nm to 580 nm range; the output is configured from the yellow and blue light to form a white light output.

In an example, the selecting of the phosphor member in the optical pathway is comprised of translating the spatial position of the phosphor members from a first position to a second position. In an example, the selecting of the phosphor member in the optical pathway is comprised of translating the spatial position of the laser beam from a first position to a second position.

In an example, the present invention provides a method and device for emitting electromagnetic radiation using non-polar or semipolar gallium containing substrates such as GaN, AlN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors, among other devices.

According to an embodiment, the present invention provides a dynamic laser-based light source or light projection apparatus including a micro-display such as a microelectromechanical system (MEMS) scanning mirror, or "flying mirror" or a digital light processing (DLP) chip to dynamically modify the spatial pattern and/or the color of the emitted light. In one example the dynamically modified emitted light is emitted directly from a laser diode, from a laser diode pumped phosphor, or from a combination of both a laser diode and a phosphor member. In one embodiment the light is pixelated to activate certain pixels and not activate other pixels to form a spatial pattern or image of light. This pattern could be formed from a white light or from a single colored light to form a monochromatic image. In another example, multiple colors are included which can be generated directly from laser diodes or laser diode pumped phosphors and are spatially patterned to form a panchromatic illumination. In another example, the dynamic light source is configured for steering or pointing the beam. The steering or pointing can be accomplished by a user input configured from a dial, switch, or joystick mechanism or can be directed by a feedback loop including sensors.

According to an embodiment, the present invention provides a dynamic laser-based light source or light projection apparatus including a housing having an aperture. The apparatus also includes an input interface for receiving a signal to activate the dynamic feature of the light source. The apparatus can include a video or signal processing module. Additionally, the apparatus includes a light source based on a laser source. The laser source includes a violet laser diode, blue laser diode, and/or green laser diode. The dynamic light feature output can be comprised of the direct output beam from one or more laser diodes, from a phosphor emission that is excited by the output beam of a laser diode, or a combination of a direct laser diode output and a phosphor emission. The violet, blue, and/or green laser diode is fabricated on a polar, nonpolar, or semipolar oriented Ga-containing substrate and has a peak operation wavelength between 390 nm and 550 nm. The apparatus also includes a laser driver module coupled to the laser source. The laser driver module generates three drive currents based on a pixel from the one or more frames of images. Each of the three drive currents is adapted to drive a laser diode. The apparatus also includes a microelectromechanical system (MEMS) scanning mirror, or "flying mirror", configured to project the laser beam to a specific location to the outside world or onto a phosphor member to generate a second wavelength emitted from the phosphor. By rastering the laser beam using the MEMS mirror a pixel in two dimensions can be formed to create a pattern or image. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention provides two or more of the different color laser diodes or at least one laser diode and a phosphor member packaged together in the same enclosure. In this copackaging embodiment, the outputs from the laser or lasers and phosphor member are combined into a beam. The apparatus also includes a laser driver module coupled to the laser source. The apparatus includes an optical member provided within proximity of the laser source, the optical member being adapted to direct the laser beam to the MEMS scanning mirror. The apparatus includes a power source electrically coupled to the laser source and the MEMS scanning mirror.

According to an embodiment, the present invention includes a housing having an aperture and an input interface for receiving one or more signals such as frames of images. The projection system also includes a processing module. In one embodiment, the processing module is electrically coupled to an ASIC for driving the laser diode and the MEMS scanning mirrors.

Depending on the application, various types of optical components may be used to combine the light outputs from the laser diodes. For example, optical components can be dichroic lenses, prisms, converging lenses, etc. In a specific embodiment, the combined laser beam is polarized.

In one embodiment, a laser driver module is provided. Among other things, the laser driver module is adapted to adjust the amount of power to be provided to the laser diode. For example, the laser driver module generates a drive current based one or more pixels from the one or more signals such as frames of images, the drive currents being adapted to drive a laser diode. In a specific embodiment, the laser driver module is configured to generate pulse-modulated signal at a frequency range of about 50 to 300 MHz.

According to an embodiment, the present invention provides a dynamic laser-based light source or light projection apparatus including a housing having an aperture. The apparatus also includes an input interface for receiving a signal to activate the dynamic feature of the light source. The apparatus can include a video or signal processing module. Additionally, the apparatus includes a light source based on a laser source. The laser source includes one or more of a violet laser diode, blue laser diode, and/or green laser diode. The dynamic light feature output can be comprised of the direct output beam from one or more laser diodes, from a phosphor emission excited by the output beam of a laser diode, or a combination of a laser diode and a phosphor member. The violet, blue, and/or green laser diode is fabricated on a polar, nonpolar, or semipolar oriented Ga-containing substrate and has a peak operation wavelength between 390 nm and 550 nm. The apparatus also includes a laser driver module coupled to the laser source. The laser driver module generates three drive currents based on a pixel from the one or more frames of images. Each of the three drive currents is adapted to drive a laser diode. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip.

According to an embodiment, the present invention provides two or more of the different color laser diodes or at least one laser diode and a phosphor member packaged together in the same enclosure. In this copackaging embodiment, the outputs from the laser or lasers and phosphor member are combined into a beam. The apparatus also includes a laser driver module coupled to the laser source. The apparatus includes an optical member provided within proximity of the laser source, the optical member being adapted to direct the laser beam to the digital light processing chip. The apparatus includes a power source electrically coupled to the laser source and the digital light processing chip.

In one embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode. In another embodiment the dynamic feature is activated by a feedback loop including a sensor. Such sensors may be selected from, but not limited to a microphone, geophone, hydrophone, a chemical sensor such as a hydrogen sensor, CO2 sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video sensor, transducer, image sensor, infrared sensor, SONAR, LIDAR, or others.

In one example of a dynamic light feature including a feedback loop with a sensor a motion sensor is included. The dynamic light source is configured to illuminate a location where the motion is detected by sensing the spatial of position of the motion and steering the output beam to that location. In another example of a dynamic light feature including a feedback loop with a sensor an accelerometer is included. The accelerometer is configured to anticipate where the laser light source apparatus is moving toward and steer the output beam to that location even before the user of the apparatus can move the light source to be pointing at the desired location. Of course, these are merely examples of implementations of dynamic light sources with feedback loops including sensors. There can be many other implementations of this invention concept that includes combining dynamic light sources with sensors.

While the above is a full description of the specific examples, various modifications, alternative constructions and equivalents may be used. Therefore, the above description and illustrations should not be taken as limiting the scope of the present invention which is defined by the appended claims.

What is claimed is:

1. A laser source apparatus for a vehicle, comprising:
   a laser device including an active region and a cavity member, the laser device configured to emit a laser beam having a first wavelength, the active region including a gallium and nitrogen containing material;
   a driving circuit electrically coupled to the laser device, the driving circuit adapted to deliver electrical energy to the laser device and generate the laser beam;
   a first optical member provided within proximity of the laser device;
   a microelectromechanical system (MEMS) scanning mirror adapted to dynamically modify a spatial pattern of an output beam;
   a phosphor member positioned remote from the laser device and configured for excitation of at least a portion of the laser beam, wherein the first optical member is adapted to direct the laser beam from the laser device to the MEMS scanning mirror, and the MEMS scanning mirror is configured to project the laser beam onto the phosphor member, the phosphor member operable in a reflective mode where at least a portion of the laser beam passing through the phosphor member is reflected by a reflective surface back through the phosphor member, and the phosphor member is configured to convert at least the portion of the laser beam from the first wavelength to a second wavelength; and
   a second optical member configured to collimate and/or project the output beam comprising at least the first wavelength and the second wavelength as a white emission.

2. The laser source apparatus of claim 1 wherein the phosphor member comprises a yttrium aluminum garnet (YAG) based phosphor.

3. The laser source apparatus of claim 1 wherein the phosphor member is coupled to the reflective surface.

4. The laser source apparatus of claim 1 wherein the first wavelength is between about 390 nm to about 480 nm.

5. The laser source apparatus of claim 1 wherein the second wavelength is between about 500 nm to 580 nm.

6. The laser source apparatus of claim 1 wherein the laser device is associated with one or more operational modes, each of the operational modes associated with an operating frequency.

7. The laser source apparatus of claim 1 wherein the laser device comprises a plurality of laser diodes sharing a single package.

8. A laser source apparatus for a vehicle, comprising:
   a laser device including an active region and a cavity member, the laser device configured to emit a laser beam having a first wavelength, the active region including a gallium and nitrogen containing material;
   a driving circuit electrically coupled to the laser device, the driving circuit adapted to deliver electrical energy to the laser device and generate the laser beam;
   a microelectromechanical system (MEMS) scanning mirror adapted to dynamically modify a spatial pattern of an output beam;
   a phosphor member disposed in an optical pathway of the laser beam and configured for excitation of at least a portion of the laser beam, wherein the MEMS scanning mirror is configured to direct the laser beam onto the phosphor member, the phosphor member operable in a reflective mode where at least a portion of the laser beam passing through the phosphor member is reflected by a reflective surface back through the phosphor member, and the phosphor member is configured to convert at least the portion of the laser beam from the first wavelength to a second wavelength; and
   a first optical member configured to collimate and/or project the output beam comprising at least the first wavelength and the second wavelength as a white emission.

9. The laser source apparatus of claim 8 further comprising a second optical member adapted to direct the laser beam from the laser device to the MEMS scanning mirror.

10. The laser source apparatus of claim 8 wherein the phosphor member is positioned remote from the laser device.

11. The laser source apparatus of claim 8 wherein the phosphor member comprises a yttrium aluminum garnet (YAG) based phosphor.

12. The laser source apparatus of claim 8 wherein the phosphor member is coupled to the reflective surface.

13. The laser source apparatus of claim 8 wherein the first wavelength is between about 390 nm to about 480 nm.

14. The laser source apparatus of claim 8 wherein the second wavelength is between about 500 nm to 580 nm.

15. A laser source apparatus for a vehicle, comprising:
   a laser device including an active region and a cavity member, the laser device configured to emit a laser beam having a first wavelength, the active region including a gallium and nitrogen containing material;
   a first optical member provided within proximity of the laser device;
   a microelectromechanical system (MEMS) scanning mirror adapted to dynamically modify a spatial pattern of an output beam;
   a phosphor member positioned remote from the laser device and configured for excitation of at least a portion of the laser beam, wherein the first optical member is adapted to direct the laser beam from the laser device to the MEMS scanning mirror, and the MEMS scanning mirror is configured to project the laser beam onto the phosphor member, the phosphor member operable in a reflective mode where at least a portion of the laser beam passing through the phosphor member is reflected by a reflective surface back through the phosphor member, and the phosphor member is configured to convert at least the portion of the laser beam from the first wavelength to a second wavelength; and
   a second optical member configured to provide the output beam comprising at least the first wavelength and the second wavelength as a white emission.

16. The laser source apparatus of claim 15 wherein the phosphor member comprises a yttrium aluminum garnet (YAG) based phosphor.

17. The laser source apparatus of claim 15 wherein the phosphor member is coupled to the reflective surface.

18. The laser source apparatus of claim 15 wherein the first wavelength is between about 390 nm to about 480 nm.

19. The laser source apparatus of claim 15 wherein the second wavelength is between about 500 nm to 580 nm.

20. The laser source apparatus of claim 15 wherein the laser device comprises a plurality of laser diodes sharing a single package.

* * * * *